US012525589B2

(12) United States Patent
Zhang et al.

(10) Patent No.: US 12,525,589 B2
(45) Date of Patent: Jan. 13, 2026

(54) LIGHT-EMITTING SUBSTRATE AND PREPARATION METHOD THEREOF, AND ARRAY SUBSTRATE

(71) Applicants: Hefei Xinsheng Optoelectronics Technology Co., Ltd., Hefei (CN); BOE TECHNOLOGY GROUP CO., LTD., Beijing (CN)

(72) Inventors: Tianyu Zhang, Beijing (CN); Min He, Beijing (CN); Tengfei Zhong, Beijing (CN); Xinxiu Zhang, Beijing (CN); Xiaodong Xie, Beijing (CN); Xue Zhao, Beijing (CN); Wenjie Xu, Beijing (CN); Huayu Sang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 1159 days.

(21) Appl. No.: 17/438,447

(22) PCT Filed: Nov. 25, 2020

(86) PCT No.: PCT/CN2020/131500
§ 371 (c)(1),
(2) Date: Sep. 12, 2021

(87) PCT Pub. No.: WO2022/109875
PCT Pub. Date: Jun. 2, 2022

(65) Prior Publication Data
US 2023/0207542 A1  Jun. 29, 2023

(51) Int. Cl.
*H01L 25/16* (2023.01)
*H01L 23/538* (2006.01)

(52) U.S. Cl.
CPC ........ *H01L 25/167* (2013.01); *H01L 23/5386* (2013.01); *H01L 25/162* (2013.01)

(58) Field of Classification Search
CPC . H01L 25/0753; H01L 25/167; H01L 25/162; H01L 23/5386; H01L 23/488; H10H 20/857
See application file for complete search history.

(56) References Cited

U.S. PATENT DOCUMENTS 6,437,764 B1 * 8/2002 Suzuki ................ G02F 1/13452
349/5
7,005,748 B2 2/2006 Kim et al.
(Continued)

FOREIGN PATENT DOCUMENTS

CN  1456959 A  11/2003
CN  1877424 A  12/2006
(Continued)

OTHER PUBLICATIONS

Written Opinion for International Application No. PCT/CN2020/131500 mailed Mar. 8, 2022.

*Primary Examiner* — Brigitte A Paterson
(74) *Attorney, Agent, or Firm* — Perilla Knox & Hildebrandt LLP; Kenneth A. Knox

(57) ABSTRACT

This disclosure relates to a light-emitting substrate, a preparation method thereof, and an array substrate, and relates to the technical field of display. The array substrate is polygonal and has at least one set of first and second lateral sides oppositely arranged, and has a first binding area arranged near the first lateral side and a second binding area arranged near the second lateral side. The array substrate includes a base substrate and a pad layer arranged on a main surface of the base substrate. The pad layer includes first binding pads in the first binding area, and second binding pads in the second binding area. Any one of the first binding area and (Continued)

the second binding area is configured to connect with a driving circuit board to drive the array substrate. The array substrate can avoid the binding pad from being damaged and thus discarding the array substrate.

18 Claims, 11 Drawing Sheets

(56) References Cited

U.S. PATENT DOCUMENTS

| | | | |
|---|---|---|---|
| 9,953,600 B2 | 4/2018 | Jang et al. | |
| 10,770,015 B2* | 9/2020 | Lee | H10D 86/40 |
| 2003/0211679 A1 | 11/2003 | Kim et al. | |
| 2007/0045516 A1* | 3/2007 | Hong | G02F 1/13452 |
| | | | 250/208.1 |
| 2008/0094321 A1* | 4/2008 | Park | G09G 3/3225 |
| | | | 445/24 |
| 2009/0309477 A1* | 12/2009 | Bang | H10K 59/131 |
| | | | 445/24 |
| 2011/0141404 A1* | 6/2011 | Kim | H01J 29/327 |
| | | | 313/503 |
| 2012/0256186 A1* | 10/2012 | Park | H10K 59/131 |
| | | | 438/34 |
| 2017/0069253 A1* | 3/2017 | Jang | G02F 1/13452 |

FOREIGN PATENT DOCUMENTS

| | | |
|---|---|---|
| CN | 101650004 A | 2/2010 |
| CN | 203838448 U | 9/2014 |
| CN | 110033711 A | 7/2019 |
| CN | 209641248 U | 11/2019 |
| CN | 110716351 A | 1/2020 |
| CN | 110908160 A | 3/2020 |
| CN | 111653598 A | 9/2020 |
| IN | 110379834 A | 10/2019 |
| WO | 2014073071 A1 | 5/2014 |
| WO | 2020191826 A1 | 10/2020 |

* cited by examiner

LIGHT-EMITTING SUBSTRATE AND PREPARATION METHOD THEREOF, AND ARRAY SUBSTRATE

CROSS-REFERENCE TO RELATED APPLICATION

This application is a national phase application under 35 U.S.C. § 371 of International Application No. PCT/CN2020/131500, filed Nov. 25, 2020, the contents of which being incorporated by reference in their entireties herein.

TECHNICAL FIELD

The invention relates to the technical field of display and, in particular, to a light-emitting substrate and a preparation method thereof, and an array substrate.

BACKGROUND

In the preparation process of Micro LED and Mini LED light-emitting substrates, in order to meet the requirement of a light-emitting diode with a larger current and reduce the voltage drop on the driving lead, the thickness or width of the driving lead may be increased to reduce the resistance.

It should be noted that the information disclosed in the above "Background" section is merely intended to reinforce understanding of the background technology of the present disclosure, accordingly the Background may include information that does not constitute the prior art as already known by an ordinary person skilled in the art.

SUMMARY

An objective of the present disclosure is to provide a light-emitting substrate, a preparation method thereof, and an array substrate, so as to prevent binding pads from being damaged and then discarding the entire array substrate.

According to one aspect of the present disclosure, an array substrate is provided. The array substrate is polygonal and has at least one set of a first lateral side and a second lateral side which are oppositely arranged, and has a first binding area arranged near the first lateral side and a second binding area arranged near the second lateral side;
    the array substrate includes a base substrate and a pad layer arranged on a main surface of the base substrate, the pad layer includes a plurality of first binding pads in the first binding area, and a plurality of second binding pads in the second binding area; any one of the first binding area and the second binding area is configured to connect with a driving circuit board to drive the array substrate.

In an exemplary embodiment of the present disclosure, the pad layer further includes a plurality of first pad sets; and the plurality of first pad sets are distributed centrally symmetrically.

In an exemplary embodiment of the present disclosure, any one of the first pad sets includes a first sub-pad and a second sub-pad arranged in pair.

In an exemplary embodiment of the present disclosure, the pad layer further includes a plurality of second pad sets, and any one of the second pad sets is configured to connect with a microchip.

In an exemplary embodiment of the present disclosure, any one of the second pad sets includes:
    a plurality of data sub-pads for connecting with at least a part of the first pad sets.

In an exemplary embodiment of the present disclosure, at least two of the first binding pads are respectively configured to load different driving signals; and at least two of the second binding pads are respectively configured to load different driving signals;
    in the plurality of first binding pads and the plurality of second binding pads, at least one of the plurality of first binding pads and at least one of the plurality of second binding pads for loading the same driving signal are symmetrical about a center axis of the base substrate.

In an exemplary embodiment of the present disclosure, the array substrate further includes a metal wiring layer;
    the metal wiring layer includes a plurality of driving leads, and the plurality of driving leads are centrally symmetrically distributed.

In an exemplary embodiment of the present disclosure, the metal wiring layer further includes a plurality of first fan-out leads for connecting the first binding area and the plurality of driving leads, and a plurality of second fan-out leads for connecting the second binding area and the plurality of driving leads; there is an overlapping area between an orthographic projection of the plurality of first fan-out leads on the base substrate and an orthographic projection of the plurality of first pad sets on the base substrate; and there is an overlapping area between an orthographic projection of the plurality of second fan-out leads on the base substrate and the orthographic projection of the plurality of first pad sets on the base substrate.

In an exemplary embodiment of the present disclosure, the metal wiring layer includes a first metal wiring layer, a planarization layer and a second metal wiring layer sequentially laminated on the base substrate, and the first metal wiring layer and the second metal wiring layer are connected through a via hole penetrating through the planarization layer;
    the first fan-out leads are all located on the first metal wiring layer;
    the second fan-out leads includes a first lead and a second lead; the first lead is located on the first metal wiring layer and electrically connected with the driving lead and the second binding pad; the second lead at least includes a first part, a second part and a third part which are sequentially connected; the first part and the third part are located on the first metal wiring layer, and the second part is located on the second metal wiring layer; the first part is electrically connected with the driving lead, and the third part is electrically connected with the second binding pad.

In an exemplary embodiment of the present disclosure, the plurality of first binding pads and the plurality of second binding pads are symmetrical about the same auxiliary line;
    the plurality of driving leads include at least one first driving lead set; any one of the first driving lead set(s) includes a plurality of first driving leads which are symmetrical about the auxiliary line and configured to load the same driving signal;
    the first leads and the first fan-out leads respectively connected with the plurality of first driving leads in any one of the first driving lead set(s) are centrally symmetrically distributed.

In an exemplary embodiment of the present disclosure, a thickness of the first metal wiring layer is greater than a thickness of the second metal wiring layer; the driving leads are all located on the first metal wiring layer.

In an exemplary embodiment of the present disclosure, a thickness difference of the driving lead at different positions along a long side direction of the array substrate does not exceed 150%.

In an exemplary embodiment of the present disclosure, thicknesses of the driving lead at two ends thereof are different along the long side direction of the array substrate; and the thickness of the driving lead at the thicker end thereof is larger than the thickness of the driving lead at the thinner end thereof by 10% or more.

In an exemplary embodiment of the present disclosure, the array substrate is rectangular and has a plurality of control areas distributed in an array, and the control areas form N control area columns arranged along a lateral side direction and 2N control area rows arranged along a long side direction, wherein N is a positive integer;

any one of the second pad sets further includes a chip power sub-pad for connecting with a chip power pin of the microchip, a first power sub-pad for connecting with a first power pin of the microchip, a driving data sub-pad for connecting with a driving data pin of the microchip, and a control signal sub-pad for connecting with a control signal pin of the microchip;

the array substrate further includes a metal wiring layer including a plurality of connection leads and a plurality of driving leads extending along the long side direction;

in any one of the control area columns, the driving leads include two second power voltage leads for loading a second power voltage, a chip power lead for loading a chip power voltage, two chip control leads for loading a chip control signal, a first power voltage lead for loading a first power voltage and a driving data lead for loading driving data;

in any one of the control areas, the array substrate includes one of the second pad sets and a plurality of pad connection circuits corresponding to the data sub-pads in the second pad sets one by one; any one of the pad connection circuits includes at least one of the first pad sets, and the first pad sets are connected through the connection leads; a first end of each of the pad connection circuits is connected with a corresponding data sub-pad through the connection lead;

in any one of the control areas, second ends of some of the pad connection circuits are electrically connected with one of the second power voltage leads through the connection leads, and second ends of other of the pad connection circuits are electrically connected with another one of the second power voltage leads through the connection leads; the chip power sub-pad is electrically connected with the chip power lead through the connection lead, the first power sub-pad is electrically connected with the first power voltage lead through the connection lead, and the driving data sub-pad is electrically connected with the driving data lead through the connection lead;

in the array substrate, the chip control leads are arranged to correspond to the control area rows one by one, and each of the control signal sub-pads in any one of the control area rows is electrically connected with a corresponding chip control lead through the connection lead.

In an exemplary embodiment of the present disclosure, in the array substrate, each of the control signal sub-pads in the $i^{th}$ control area row is electrically connected with the $i^{th}$ chip control lead through the connection lead; or, in the array substrate, each of the control signal sub-pads in the $i^{th}$ control area row is electrically connected with the $(2N-i+1)^{th}$ chip control lead through the connection lead;

wherein $1 \leqslant i \leqslant 2N$, and i is a positive integer.

According to one aspect of the present disclosure, a light-emitting substrate including the above-mentioned array substrate is provided.

In an exemplary embodiment of the present disclosure, the light-emitting substrate further includes a plurality of light-emitting elements corresponding to and being bound with the plurality of first pad sets one by one; and/or the light-emitting substrate further includes a plurality of microchips corresponding to and being bound with the second pad sets one by one.

In an exemplary embodiment of the present disclosure, the light-emitting substrate includes a plurality of array substrates spliced with each other.

In an exemplary embodiment of the present disclosure, thicknesses of the driving lead at two ends thereof are different along a long side direction of the array substrate, the light-emitting substrate has a first side and a second side oppositely arranged, and the array substrates all are arranged side by side along an extending direction of the first side; a part of the driving lead with larger thickness in each of the array substrates is close to the first side of the light-emitting substrate; and a part of the driving lead with smaller thickness in each of the array substrates is close to the second side of the light-emitting substrate.

According to one aspect of the present disclosure, a preparation method of a light-emitting substrate is provided. The preparation method includes:

providing a base motherboard including a plurality of base areas where an array substrate is to be formed; any one of the base areas has a central axis perpendicular to a plane where the base area is located;

forming driving leads and a pad layer of each of the array substrates on each of the base areas; the driving lead of any one of the array substrates has a first end close to an edge of the base motherboard and a second end away from the edge of the base motherboard; the pad layer of any one of the array substrates includes a plurality of first pad sets, and the plurality of first pad sets are centrally symmetrically distributed about a central axis of the base substrate as a symmetry center;

cutting the base motherboard to obtain the array substrates;

arranging a light-emitting element layer on any one of the array substrates, wherein the light-emitting element layer includes a plurality of light-emitting elements correspondingly bound with the first pad sets of the array substrate one by one; and splicing the array substrates into the light-emitting substrate, wherein in the same light-emitting substrate, the array substrates are arranged along an extending direction perpendicular to the driving leads, and a first end of each of the driving leads of the array substrate is close to an edge of the light-emitting substrate, and a second end of each of the driving leads of the array substrate is close to another edge of the light-emitting substrate.

Other characteristics and advantages of the present disclosure will become apparent through the following detailed description, or partly learned through the practice of the present disclosure.

It should be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute part of this specification, illustrate embodiments consistent with the invention and, together with the description, serve to explain the principles of the invention. Apparently, the drawings in the following description are only for illustrating some embodiments of the present disclosure and those of ordinary skill in the art can also derive other drawings based on the drawings without paying any creative labor.

FIG. 1-2 schematically shows a structural schematic diagram of a light-emitting substrate according to an embodiment of the present disclosure.

FIG. 2 schematically shows a partial structural schematic diagram of an array substrate according to an embodiment of the present disclosure.

DETAILED DESCRIPTION

Figure 1:
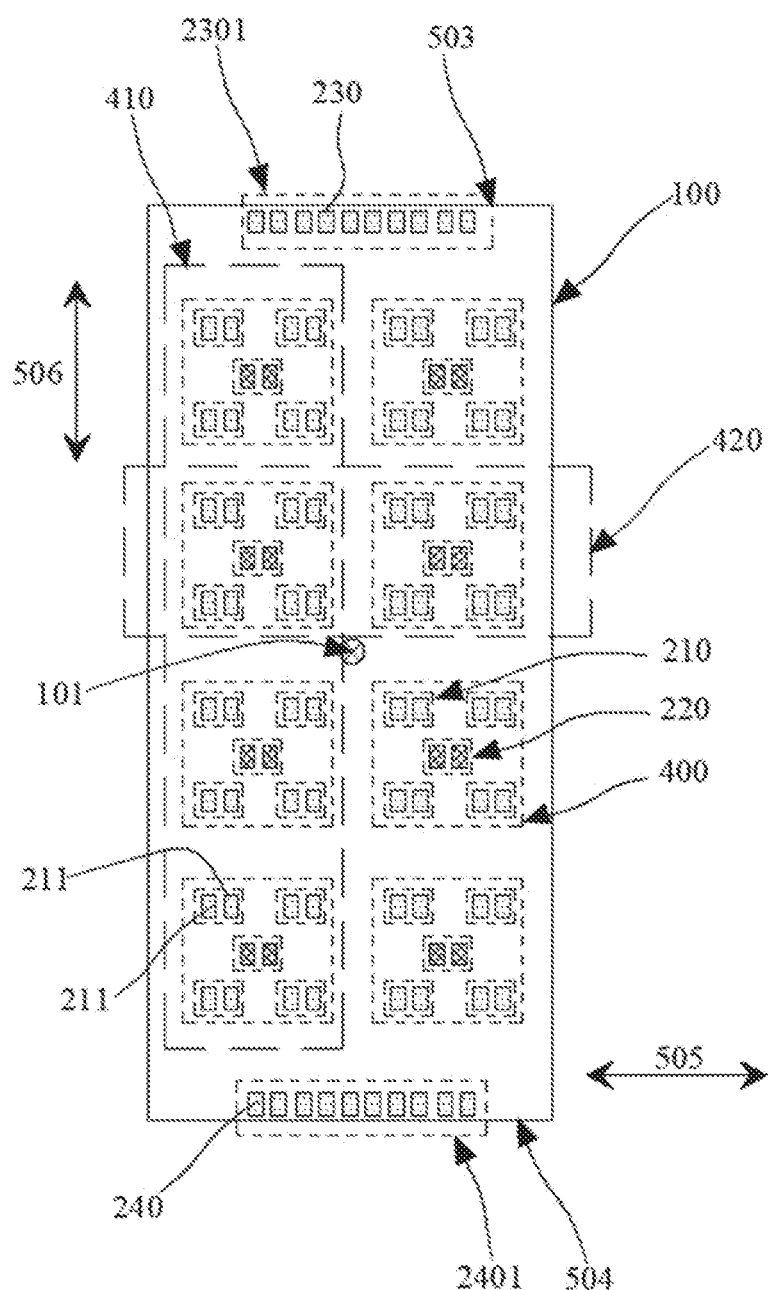
FIG. 1-1 schematically shows a structural schematic diagram of an array substrate according to an embodiment of the present disclosure.

Exemplary embodiments will now be described more fully with reference to the accompanying drawings. However, the exemplary embodiments may be embodied in a variety of forms and should not be construed as being limited to the embodiments set forth herein. On the contrary, the embodiments are provided to make the present disclosure comprehensive and through and to fully convey the concept of the exemplary embodiments to those skilled in the art. The above-described features, structures or characteristics may be combined in one or more embodiments in any suitable way. Wherever possible, features discussed in each embodiment are interchangeable. In the foregoing description, numerous specific details are provided to acquire a full understanding of embodiments of the present disclosure. However, those skilled in the art will recognize that technical solutions of the present disclosure may be practiced without one or more of the specific details, or, other methods, components, materials and so on may be used. In other cases, well-known structures, materials, or operations are not shown or described in detail to avoid obscuring various aspects of the present disclosure.

In addition, the drawings are merely schematic illustrations of the present disclosure and are not necessarily drawn to scale. The same reference numerals in the drawings refer to same or similar parts, and the repeated descriptions thereof will be omitted. Some of the block diagrams shown in the drawings are functional entities, which do not necessarily correspond to physically or logically independent entities. These functional entities can be implemented in the form of software, in one or more hardware modules or integrated circuits, or in different networks and/or processor devices and/or microcontroller devices.

The terms "a", "an", "the", "said" and "at least one", are used to express the presence of one or more the element/constitute/or the like. The terms "comprise", "include" and "have" are intended to be inclusive, and mean there may be additional elements/constituents/ or the like other than the listed elements/constituents/or the like. The "first" and "second" are used only as marks, and are not numerical restriction to the objects.

The reference numbers of various elements in the drawings are described as follows: 100: array substrate; 101: central axis of array substrate; 210: first pad set; 211: first sub-pad; 212: second sub-pad; 220: second pad set; 221: chip power sub-pad; 222: first power sub-pad; 223: driving data sub-pad; 224: control signal sub-pad; 225: data sub-pad; 2301: first binding area; 230: first binding pad; 231: chip power voltage first pad; 232: first power voltage first pad; 233: driving date first pad; 234: chip control signal first pad; 235: second power voltage first pad; 2401: second binding area; 240: second binding pad; 241: chip power voltage second pad; 242: first power voltage second pad; 243: driving data second pad; 244: chip control signal second pad; 245: second power voltage second pad; 310: connection lead; 320: driving lead; 321: chip power lead; 322: first power voltage lead; 323: driving data lead; 324: chip control lead; 325: second power voltage lead; 330: first fan-out lead; 340: second fan-out lead; 341: first lead; 342: second lead; 3421: first part of second lead; 3422: second part of second lead; 3423: third part of second lead; 3511: first part of chip power voltage fan-out lead; 3512: second part of chip power voltage fan-out lead; 3513: third part of chip power voltage fan-out lead; 3611: first part of driving data fan-out lead; 3612: second part of driving data fan-out lead; 3613: third part of driving data fan-out lead; 400: control area; 410: control area column; 420: control area row; 401: pad connection circuit; 402: light-emitting circuit; 501: first end of array substrate; 502: second end of array substrate; 503: first lateral side of array substrate; 504: second lateral side of array substrate; 505: lateral side direction of array substrate; 506: long side direction of array substrate; 600: base motherboard; 710: first side of light-emitting substrate; 720: second side of light-emitting substrate; 800: microchip; 810: chip power pin; 820: first power pin; 830: driving data pin; 840: control signal pin; 850: output pin; and 900: light-emitting element.

The present disclosure provides an array substrate. Referring to FIG. 1-1, the array substrate 100 is polygonal and has at least one set of first lateral side 503 and second lateral side 504 which are oppositely arranged, and has a first binding area 2301 arranged near the first lateral side 503 and a second binding area 2401 arranged near the second lateral side 504. It can be understood that the mentioned shape refers to a shape of an orthographic projection of the array substrate on a plane where a main surface of the array substrate is located, for example, it may be rectangular, square, rhombic, regular polygonal, or in other shapes. The first lateral side and the second lateral side may be two relatively short sides of a rectangle or any two opposite sides of a square, a rhombus, or a regular polygon. Arranging near the first lateral side or the second lateral side can be understood as arranging along the first lateral side or the second lateral side, and providing a certain distance from the first lateral side or the second lateral side, for example, a value of 0-1.5 mm.

The array substrate includes a base substrate and a pad layer arranged on the main surface of the base substrate. The pad layer includes a plurality of first binding pads 230 located in the first binding area 2301, and a plurality of second binding pads 240 located in the second binding area 2401. Any one of the first binding area 2301 and the second binding area 2401 is configured to connect with a driving circuit board to drive the array substrate 100.

In the array substrate 100 provided by the present disclosure, two binding areas, i.e., the first binding area 2301 and the second binding area 2401, are provided, and both the binding areas may be configured to connect with the driving circuit board to drive the array substrate 100 or a light-emitting substrate based on the array substrate 100. When the driving circuit board is bound to one of the first binding pad 230 or the second binding pad 240 of the array substrate 100, and if the binding therebetween is poor, the driving circuit board may be reused, and then is bound to another binding pad. That is, in the process of removing the driving circuit board, if the first binding pad 230 is damaged, it may be replaced with the second binding pad 240 to bind the driving circuit board without discarding the array substrate 100, thereby improving a yield of the array substrate 100 in the whole process, improving a utilization rate of the array substrate 100, and preventing the array substrate 100 from being discarded due to the damage of the binding pad.

Hereinafter, the structure, the principle and the method of the array substrate 100 of the present disclosure will be further explained and illustrated with reference to the drawings.

The array substrate includes the base substrate and the pad layer arranged on the main surface of the base substrate. Referring to FIG. 1-1, the pad layer includes a plurality of first pad sets 210, and the plurality of first pad sets 210 are distributed symmetrically. In this way, after rotating 180 degrees along symmetry centers of the first pad sets 210, a spatial position distribution of the first pad sets 210 will not be changed. Therefore, if it is necessary to replace the binding pads that bind the circuit board, for example, to change the first binding pads 230 into the second binding pads 240, the array substrate may be rotated by 180 degrees along the symmetry center of the first pad sets 210 and then bound to the circuit board, thereby further maintaining a position of the circuit board unchanged while maintaining the spatial position distribution of the first pad sets 210 unchanged.

Further, referring to FIG. 1-1, all the first binding pads 230 and all the second binding pads 240 are distributed symmetrically. Furthermore, the symmetry centers of all the first binding pads 230 and all the second binding pads 240 coincide with the symmetry center of all the first pad sets 210.

It can be understood that a plurality of first sub-pads and/or second sub-pads at the outermost side of the plurality of first pad sets are connected to form a pad area. The pad area has a central axis, and the plurality of first pad sets are distributed centrally symmetrically about the central axis of the pad area.

Optionally, the base substrate has a central axis 101 which may coincide with the central axis of the pad area, so that the plurality of first pad sets 210 are distributed centrally symmetrically with respect to the central axis 101 of the base substrate. In this way, the array substrate 100 provided by the present disclosure includes the first pad sets 210 centrally symmetrically distributed, and the position of the first pad sets 210 may be kept unchanged after the array substrate 100 are rotated by 180 degrees along the central axis 101 of the base substrate. In this way, when a plurality of array substrates 100 need to be spliced into a large spliced array substrate, any one of the array substrates 100 may be rotated by 180 degrees as required to ensure the position of each of the first pad sets 210 on the spliced array substrate unchanged, thereby ensuring that the function of the spliced array substrate will not be affected by rotation of a single base substrate.

Optionally, referring to FIG. 1-1, the array substrate 100 provided by the present disclosure has the first pad sets 210 centrally symmetrically distributed about the center axis 101 of the base substrate, and each of the first pad sets 210 may be bound and connected with functional devices to form a functional substrate. In this way, each of the functional devices of the functional substrate is centrally symmetrical about the central axis of the base substrate. When a plurality of functional substrates are spliced into a large spliced functional substrate, any one of the functional substrates is rotated by 180 degrees along the central axis of the base substrate thereof, without affecting a position distribution of each of the functional devices on the spliced functional substrate. The functional device may be a current-driven element, such as a heating element, a light-emitting element, a sound-emitting element, etc., and may also be a photo-sensitive element or a thermosensitive element for outputting current or voltage.

As an example, the first pad sets 210 of the array substrate 100 provided by the present disclosure may be configured to bind light-emitting elements, for example, binding micro light-emitting diodes (including Micro LEDs and Mini LEDs) etc., so that a light-emitting substrate may be formed. Further, the light-emitting substrates each with one array substrate 100 may be spliced with each other to form a larger-sized light-emitting substrate. It can be understood that the first pad sets 210 may also be configured to bind other sensors, such as temperature sensors, pressure sensors, infrared sensors, and other electronic components. In this case, the first pad set 210 may include a plurality of sub-pads. In some embodiments, all of the first pad sets 210 may be configured to bind micro LEDs, sensors or the like, or some of the first pad sets 210 are configured to bind micro LEDs and some are configured to bind sensors, or even some of the first pad sets 210 are not bound with any electronic components.

In some embodiments, the pad layer of the array substrate 100 provided by the present disclosure may further include a third pad for binding other electronic components. The position and the function of the third pad will not be limited in the present disclosure, and can be provided according to actual requirements.

Figure 5:
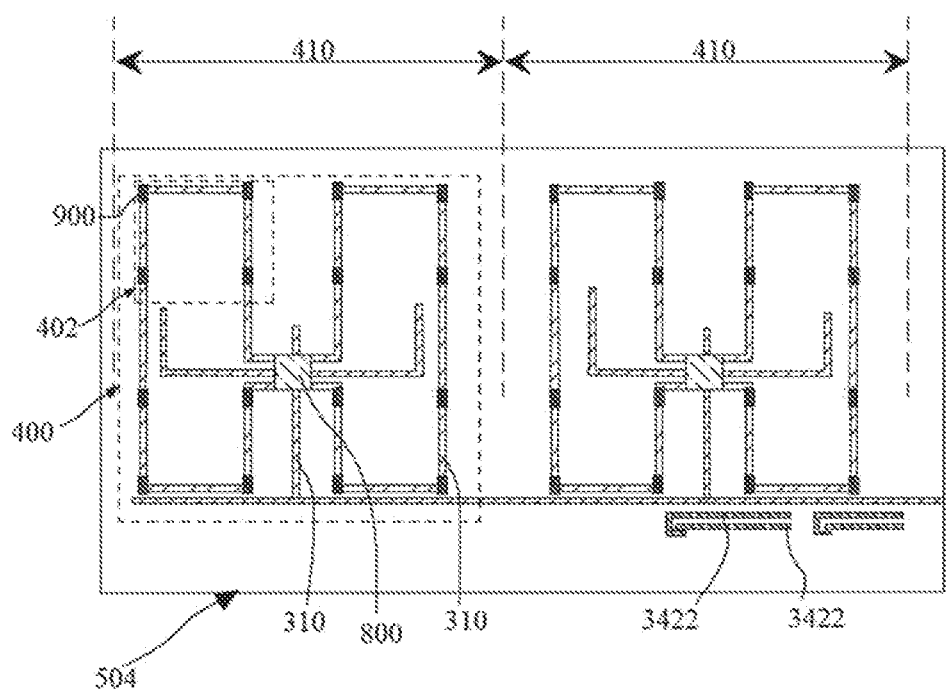
FIG. 5 schematically shows a partial structural diagram of a second metal wiring layer, a light-emitting element, and a microchip in the area A in FIG. 1-2.
Figure 6:
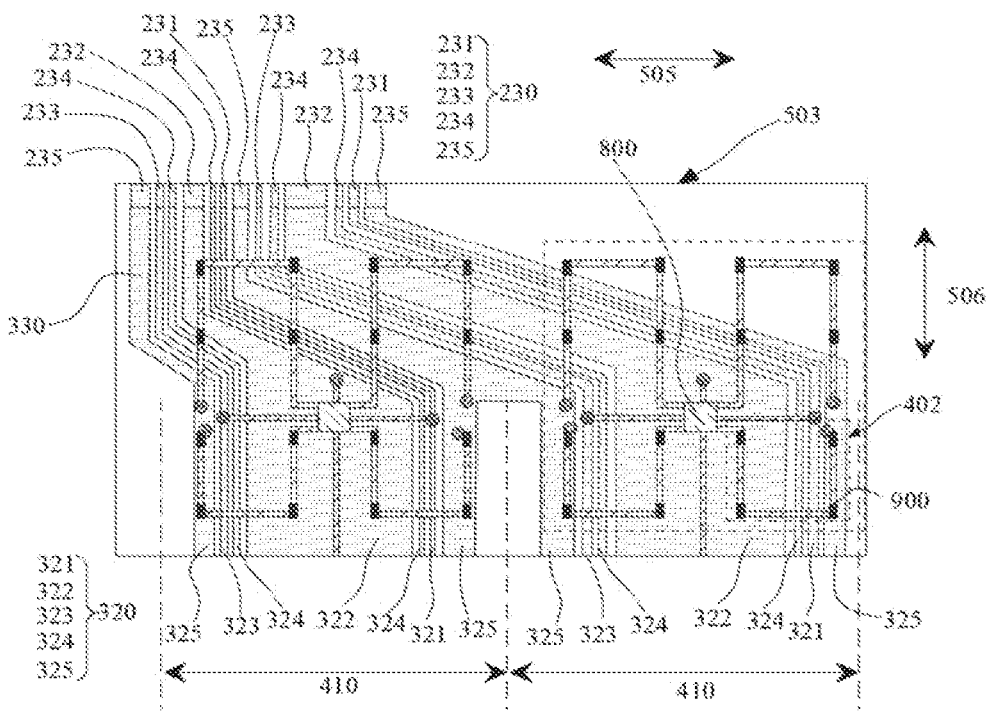
FIG. 6 schematically shows a partial structural diagram of the area A in FIG. 1-2.
Figure 17:
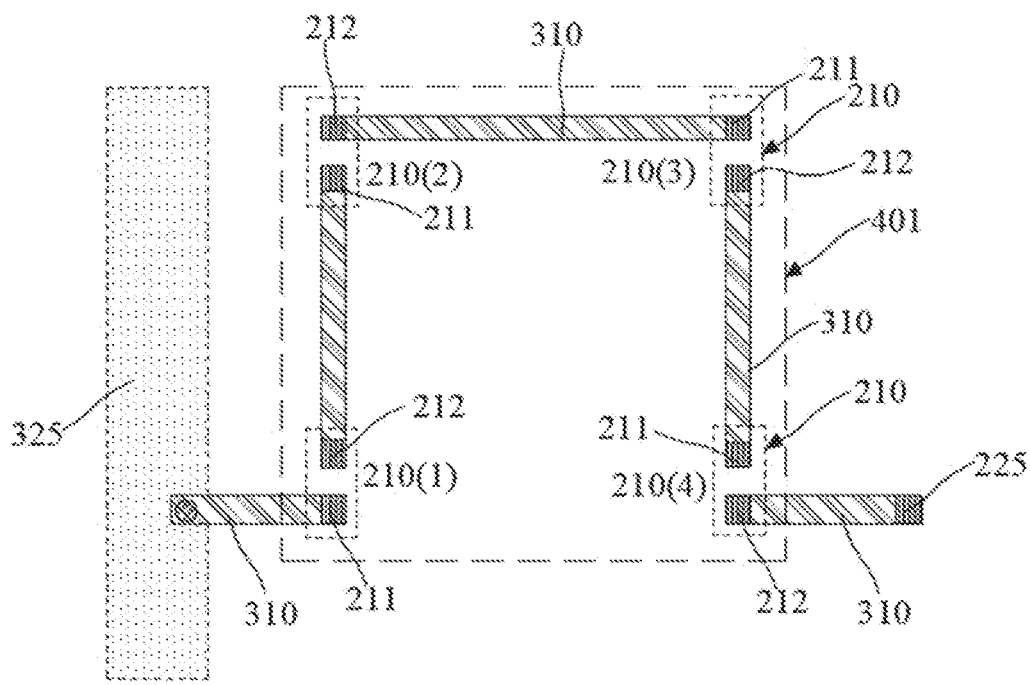
FIG. 17 schematically shows a structural diagram of a pad connection circuit.

Optionally, referring to FIGS. 1-1, 5 and 17, any one of the first pad sets 210 includes a first sub-pad 211 and a second sub-pad 212 arranged in pair. In this way, the first sub-pad 211 and the second sub-pad 212 may be configured to electrically connect with both electrodes of the light-emitting element 900. In any one of the first pad sets 210, arrangement directions of the first sub-pads 211 and the second sub-pads 212 may be parallel to an extension direction of one edge of the base substrate, or may not be parallel to the extension direction of any edge of the base substrate. In any two of the first pad sets 210, the arrangement directions of the first sub-pads 211 and the second sub-pads 212 may be same or different, and the present disclosure is not particularly limited thereto, so that each of the first pad sets 210 may be symmetrical with respect to the central axis 101 of the base substrate. Preferably, each of the first sub-pads 211 and each of the second sub-pads 212 as a whole are symmetrical about the central axis 101 of the base substrate.

Optionally, referring to FIG. 1-1, the pad layer may further include a plurality of second pad sets 220. Referring to FIG. 5, any one of the second pad sets 220 is configured to connect with a microchip 800. In this way, the light-emitting elements 900 and the microchip 800 may be bound to the array substrate 100 to form a light-emitting substrate, and the microchip 800 is configured to control light emission of each of the light-emitting elements 900. It can be understood that the microchip 800 is an integrated circuit chip in which a side length or a diagonal length or a diameter is about 300 um or less than 300 um.

The second pad set 220 may include sub-pads corresponding to pins of the microchip 800 one by one, and the number and the type thereof may be set according to the type and the pins of the microchip 800. Optionally, any one of the second pad sets 220 at least includes a plurality of data sub-pads 225 for connecting with output pins 850 of the microchip 800 one by one, and the plurality of data sub-pads 225 are also connected with at least a part of the first pad sets.

Figure 3:
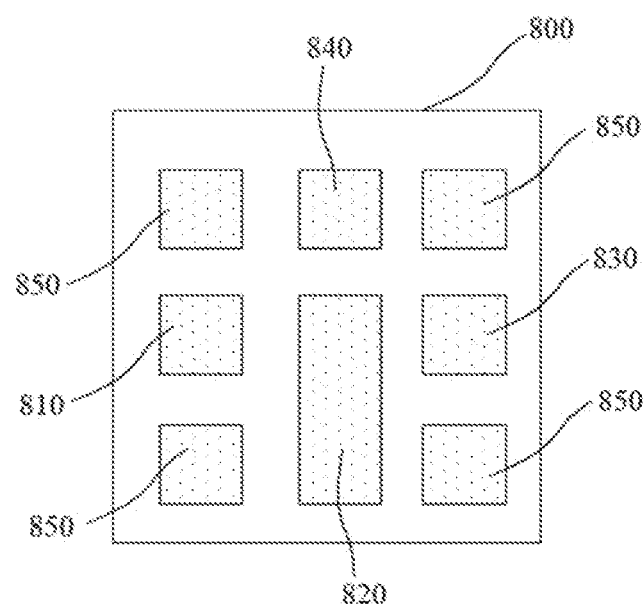
FIG. 3 schematically shows a structural schematic diagram of pins of a microchip according to an embodiment of the present disclosure.

As an example, in an embodiment of the present disclosure, referring to FIG. 3, the microchip 800 has a chip power pin 810 for loading a chip power voltage, a first power pin 820 for loading a first power voltage, a driving data pin 830 for loading a driving data, a control signal pin 840 for loading a chip control signal, and a plurality of output pins 850.

Figures 1, 2:
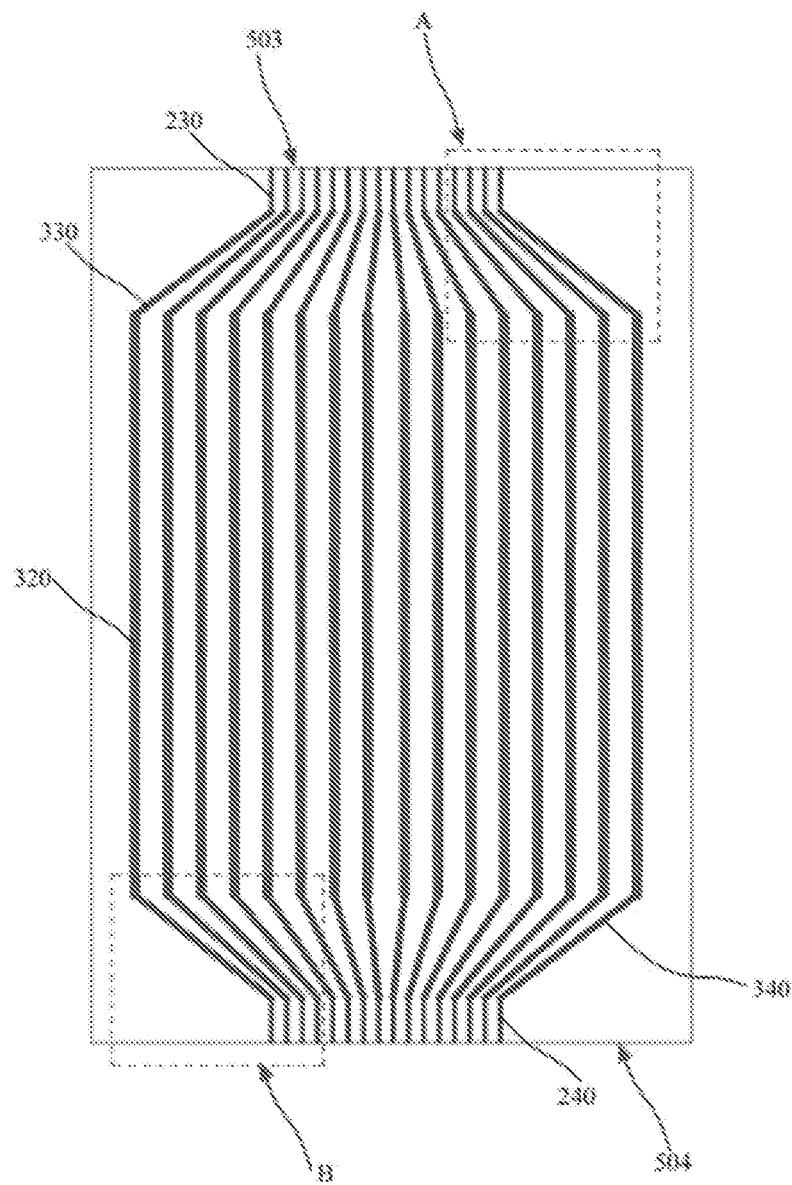
Figure 2:
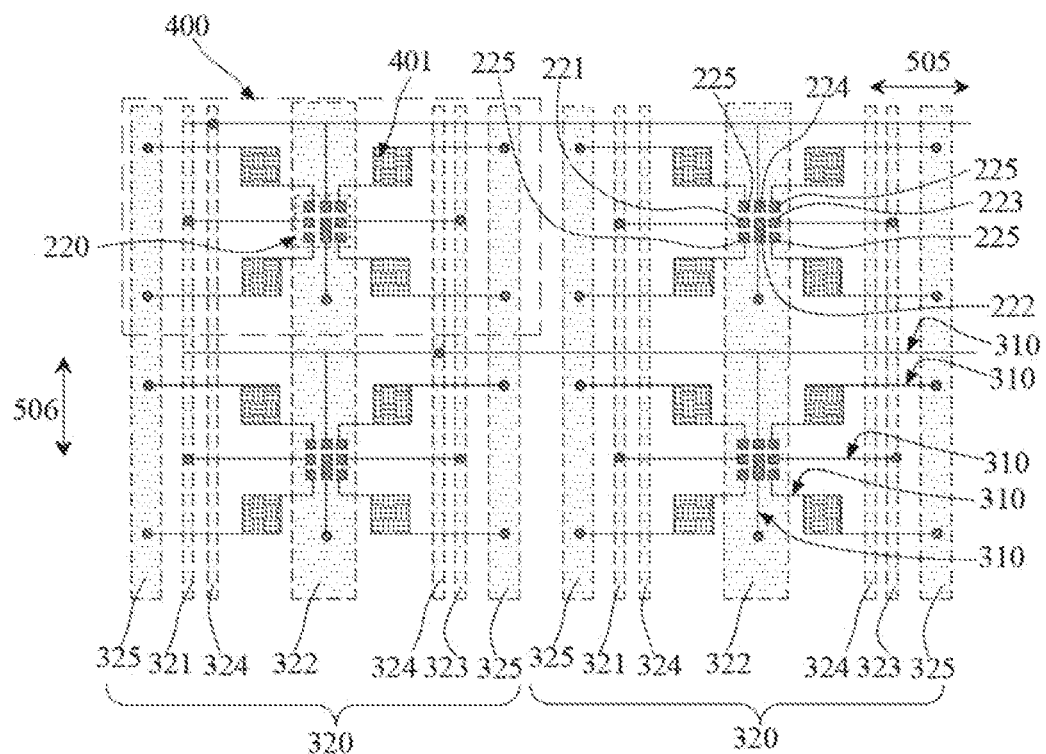

Accordingly, referring to FIG. 2, any one of the second pad sets 220 includes:

a chip power sub-pad 221 for connecting with the chip power pin 810 of the microchip 800;

a first power sub-pad 222 for connecting with the first power pin 820 of the microchip 800;

a driving data sub-pad 223 for connecting with the driving data pin 830 of the microchip 800;

a control signal sub-pad 224 for connecting with the control signal pin 840 of the microchip 800; and a plurality of data sub-pads 225 for connecting with at least a part of the plurality of first pad sets.

Optionally, referring to FIG. 1-1, the array substrate 100 having a centrosymmetric polygon has at least one set of a first lateral side edge 503 and a second lateral side edge 504 which are oppositely arranged, and has a first binding area 2301 arranged along the first lateral side edge 503 and a second binding area 2401 arranged along the second lateral side edge 504. The pad layer further includes a plurality of first binding pads 230 located in the first binding area 2301 and a plurality of second binding pads 240 located in the second binding area 2401. Any one of the first binding area 2301 and the second binding area 2401 is configured to connect with the driving circuit board to drive the array substrate 100.

It has been found that if the driving lead is made by electroplating, a thickness of the driving lead is different in different areas due to the process limitation, that is, the thickness uniformity of the driving lead on the light-emitting substrate is poor. Furthermore, if there is only one binding area on each of the light-emitting substrates, when the plurality of light-emitting substrates are spliced into a large-sized substrate and the plurality of binding areas are located at the same side of the large-sized substrate, the overall poor uniformity of the substrate will increase in a multiple, greatly improving the difficulty of debugging and testing of the whole substrate and affecting the improvement of the overall reliability of the substrate.

In the array substrate 100 provided by the present disclosure, two binding areas, i.e., the first binding area 2301 and the second binding area 2401, are provided, and both binding areas may be configured to connect with the driving circuit board to drive the array substrate 100 or the light-emitting substrate based on the array substrate 100. In this way, when the plurality of array substrates 100 are spliced, if one of the array substrates 100 is rotated by 180 degrees, the binding area of the array substrate 100 for binding with the driving circuit board may be changed, so that the driving circuit board is still located at the same side of the spliced array substrate 100. As an example, after splicing the plurality of array substrates 100, the driving circuit board of each of the array substrates 100 may be located at the same side of the spliced array substrate 100, and the first binding area 2301 of each of the array substrates 100 is configured to bind the driving circuit board. If one array substrate 100 is required to be rotated by 180 degrees along the central axis of the base substrate, the second binding area 2401 of the array substrate 100 may be connected with the driving circuit board after the rotation, so that the driving circuit board of each of the array substrates 100 is still located at the same side of the spliced array substrate 100.

The planar shape of the array substrate 100 is a centrosymmetric polygon, and especially the planar shape of the base substrate may be a polygon symmetrical about its central axis 101. For example, the base substrate may have a shape of rectangle, rhombus, regular hexagon, or the like. In this way, it is ensured that the array substrate 100 will not spatially collide with other array substrates 100 after rotating by 180 degrees, thereby ensuring effective splicing.

In some embodiments, the array substrate 100 is rectangular, and has two opposite long sides and two opposite lateral sides 503/504.

In some embodiments, at least two of the plurality of first binding pads 230 are respectively configured to load different driving signals. At least two of the plurality of second binding pads 240 are respectively configured to load different driving signals. In the plurality of first binding pads 230 and the plurality of second binding pads 240, at least one of the plurality of first binding pads 230 and at least one of the plurality of second binding pads 240 for loading the same kind of driving signals are symmetrical about the central axis 101 of the base substrate.

In this way, the first binding pad 230 and the second binding pad 240 may be bound and connected with the same driving circuit board, without providing two different driving circuit boards for the first binding pad 230 and the second binding pad 240, thereby realizing the re-usage of driving circuit board, saving costs of design, test and material, and reducing costs of products applying the array substrate 100. In other words, pin sequences of the first binding area 2301 and the second binding area 2401 on the corresponding driving circuit board are completely consistent, and it is only required to design a corresponding driving circuit board to meet the requirements of driving the array substrate 100 in either of the first binding area 2301 and the second binding area 2401.

In an embodiment of the present disclosure, in the plurality of first binding pads 210 and the plurality of second binding pads 220, the first binding pad 210 and the second binding pad 220 for loading the same kind of driving signals are symmetrical about the central axis 101 of the base substrate.

Figure 11:
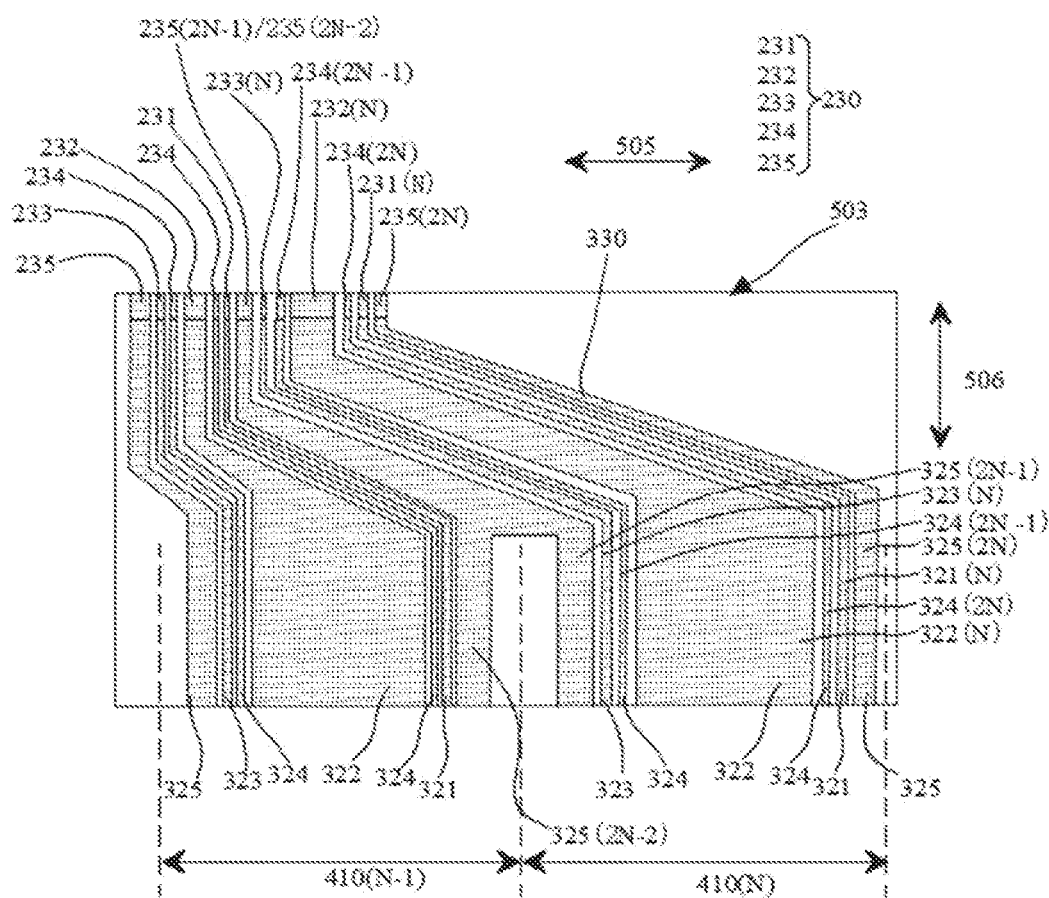
FIG. 11 schematically shows a connection relationship among a driving lead, a first fan-out lead and the first binding pad in the area A in FIG. 1-2.
Figure 12:
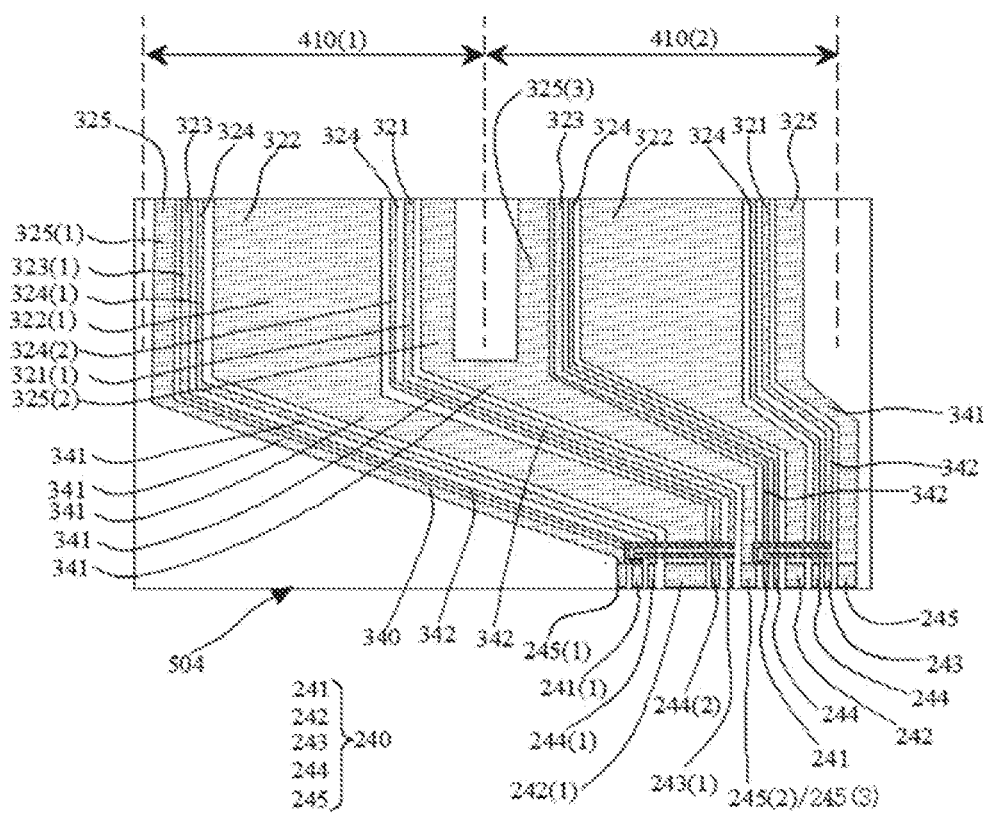
FIG. 12 schematically shows a connection relationship among a driving lead, a first fan-out lead and the first binding pad in the area B in FIG. 1-2.
Figure 13:
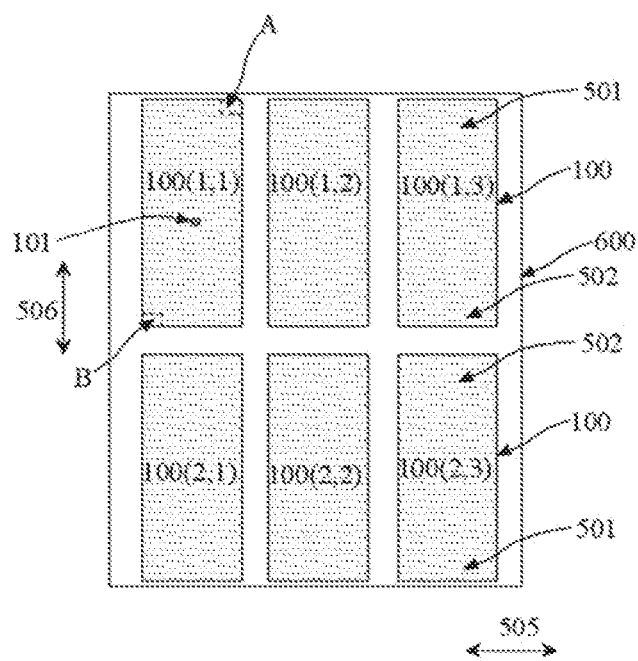
FIG. 13 schematically shows a structural diagram of preparing a plurality of array substrates on a base motherboard according to an embodiment of the present disclosure.

As an example, referring to FIGS. 11-13, FIG. 11 shows a distribution of the first binding pads 230 in an area A in FIG. 1-2, and FIG. 12 shows a distribution of the second binding pads 240 in an area B in FIG. 1-2. In the area A, the first binding pads 230 include the last one 235(2N) of second power voltage first pads for loading a second power voltage, the last one 231(N) of chip power voltage first pads for loading a chip power voltage, the last one 234(2N) of chip control signal first pads for loading a chip control signal, the last one 232(N) of first power voltage first pads for loading a first power voltage, the penultimate one 234(2N−1) of chip control signal first pads for loading the chip control signal, the last one 233(N) of driving data first pads for loading driving data, and the penultimate one 235(2N−1) of second power voltage first pads for loading the second power voltage. In the area B, the second binding pads 240 include the first one 245(1) of second power voltage second pads for loading the second power voltage, the first one 241(1) of chip power voltage second pads for loading the chip power voltage, the first one 244(1) of chip control signal second pads for loading the chip control signal, the first one 242(1) of first power voltage second pads for loading the first power voltage, the second one 244(2) of chip control signal second pads for loading the chip control signal, the first one 243(1) of driving data second pads for loading driving data, and the second one 245(2) of second power voltage second pads for loading the second power voltage. The second power voltage first pad 235(2N) and the second power voltage second pad 245(1) are symmetrical about the central axis of the base substrate. The chip power voltage first pad 231(N) and the chip power voltage second pad 241(1) are symmetrical about the central axis of the base substrate. The chip control signal first pad 234(2N) and the chip control signal second pad 244(1) are symmetrical about the central axis of the base substrate. The first power voltage first pad 232(N) and the first power voltage second pad 242(1) are symmetrical about the central axis of the base substrate. The chip control signal first pad 234(2N−1) and the chip control signal second pad 244(2) are symmetrical about the central axis of the base substrate. The driving data first pad 233(N) and the driving data second pad 243(1) are symmetrical about the central axis of the base substrate. The second power voltage first pad 235(2N−1) and the second power voltage second pad 245(2) are symmetrical about the central axis of the base substrate.

In some embodiments, the driving circuit board for binding with the first binding pad 230 and the second binding pad 240 may have a flexible substrate, which may specifically be a flexible printed circuit board (FPC) or a chip on film (COF).

Optionally, the array substrate 100 further includes a metal wiring layer. Referring to FIGS. 1-2 and 2 (in which driving leads 320 are filled in the dashed frame), the metal wiring layer includes a plurality of driving leads 320. The driving leads 320 are distributed centrally symmetrically (or centrosymmetrically). Referring to FIGS. 1-1, 2, 4, 9, and 10, the driving leads 320 are configured to connect with the first binding pads 230 and the second binding pads 240, and transmit respective driving signals loaded on the first binding pads 230 and/or the second binding pads 240 to various required areas of the array substrate 100. The driving leads 320 are centrally symmetrically distributed about the central axis of the base substrate as the symmetry center, ensuring that the distribution of the driving leads 320 is unchanged after the array substrate 100 is rotated by 180 degrees along the central axis of the base substrate, thereby avoiding the influence on the light-emitting element 900 bound on the first pad set 210 due to the change of the driving leads 320.

In an embodiment of the present disclosure, all the driving leads 320 are centrally symmetrically distributed about the center axis 101 of the base substrate as the symmetry center.

The number and the type of the driving leads 320 may be determined according to the circuit arrangement of the array substrate 100, as long as the light-emitting substrate based on the array substrate 100 can be driven. In an embodiment of the present disclosure, referring to FIG. 2, the driving leads 320 include a second power voltage lead 325 for loading the second power voltage, a chip power lead 321 for loading the chip control signal, a chip control lead 324 for loading the chip control signal, a first power voltage lead 322 for loading the first power voltage and a driving data lead 323 for loading driving data.

Figure 4:
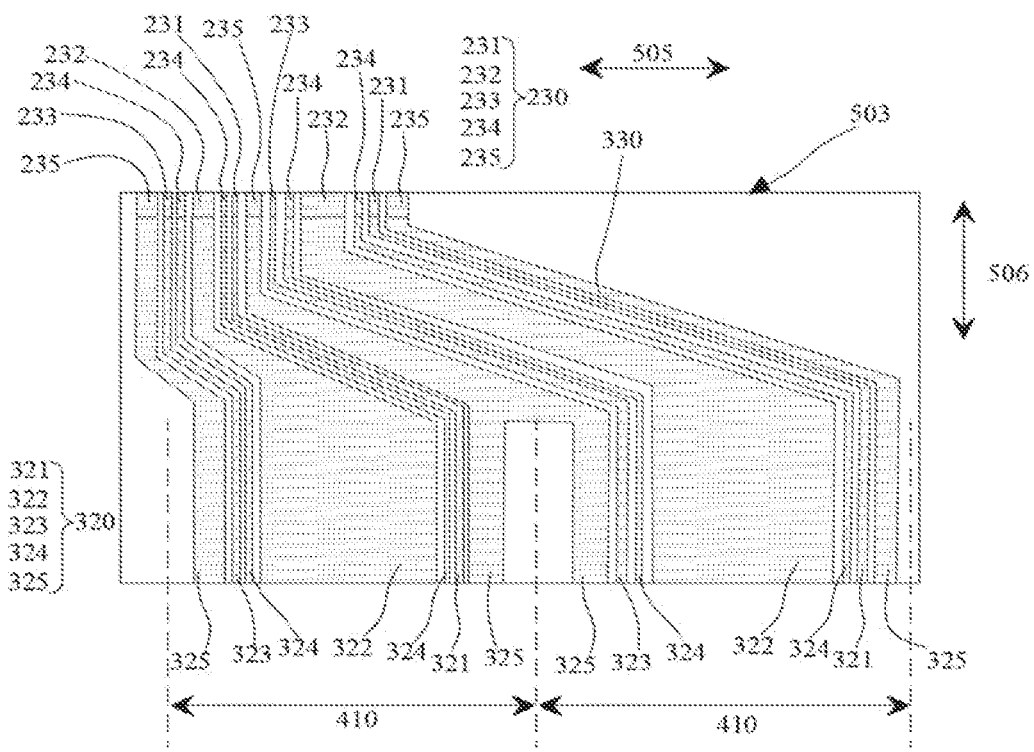
FIG. 4 schematically shows a partial structural diagram of a first metal wiring layer and a first binding pad in an area A in FIG. 1-2.
Figure 7:
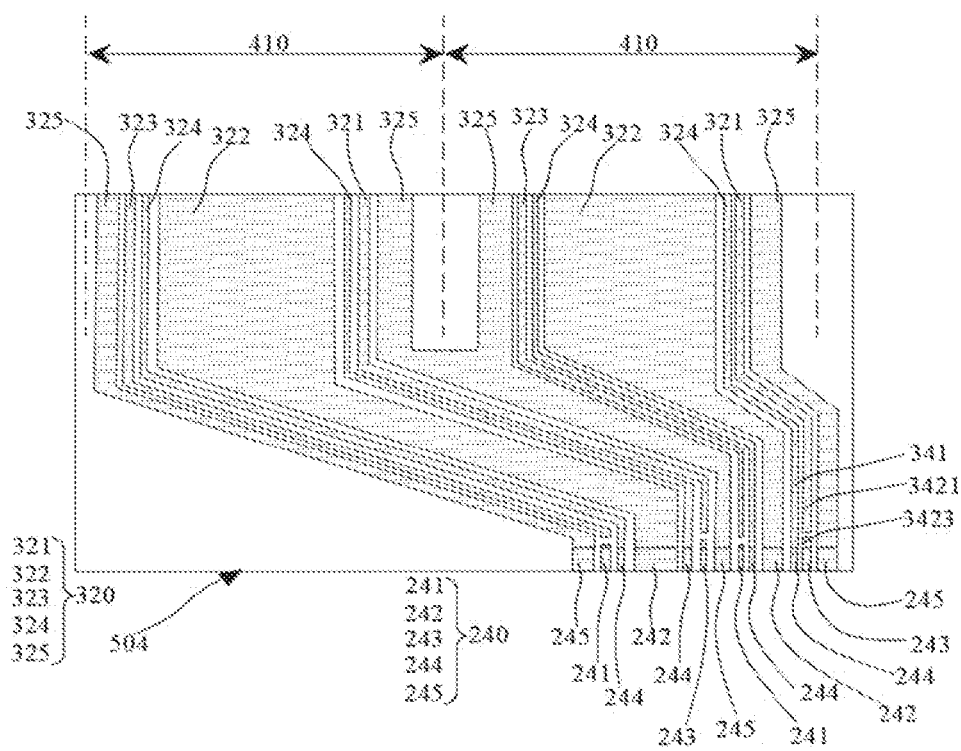
FIG. 7 schematically shows a partial structural diagram of a first metal wiring layer and a first binding pad in an area B in FIG. 1-2.

Accordingly, referring to FIG. 4, the first binding pads 230 include a second power voltage first pad 235 for loading the second power voltage, a chip power voltage first pad 231 for loading the chip power voltage, a chip control signal first pad 234 for loading the chip control signal, a first power voltage first pad 232 for loading the first power voltage, and a driving data first pad 233 for loading driving data. Referring to FIG. 7, the second binding pads 240 include a second power voltage second pad 245 for loading the second power voltage, a chip power voltage second pad 241 for loading the chip power voltage, a chip control signal second pad 244 for loading the chip control signal, a first power voltage second pad 242 for loading the first power voltage, and a driving data second pad 243 for loading driving data.

In FIGS. 4 and 7, each of the first binding pads 230 and the second binding pads 240 is formed as a whole pad surface, a width of which is determined according to the size of load to be driven. As an example, the second power voltage may be an anode voltage (VLED) for driving the light-emitting element to emit light, and in order to ensure that it has sufficient driving capability, the second power voltage first pad 235 and the second power voltage second pad 245 may have larger widths. As another example, the first power voltage may be a reference voltage of the array substrate, for example, a ground voltage (GND). In order to ensure the stability of the first power voltage, the width of any of the first power voltage first pad 232 and the first power voltage second pad 242 may be not less than the width of the second power voltage first pad 235, for example, twice the width of the second power voltage first pad 235. As another example, the chip power voltage, chip control signal and driving data are all configured to control the operation of the chip to control light-emitting elements with relatively small loads, so the width of any of the chip power voltage first pad 231, the chip power voltage second pad 241, the driving data first pad 233, the driving data second pad 243, the chip control signal first pad 234 and the chip control signal second pad 244 may be smaller than the width of the second power voltage first pad 235.

It can be understood that each of the first binding pads and the second binding pads may also be composed of one or more binding electrodes, and the binding electrodes have a gap therebetween. The number of binding electrodes included in each of the first binding pads and the second binding pads may be adjusted to determine the width of each of the first binding pads and the second binding pads. For example, the first binding area may be provided with a plurality of binding electrodes arranged at equal intervals along the first lateral side direction; wherein, one binding electrode or a plurality of adjacent binding electrodes may form one first binding pad, and there is no multiplexing of binding electrodes between the first binding pads. The second binding area may be provided with a plurality of binding electrodes arranged at equal intervals along the second lateral side direction; wherein one binding electrode or a plurality of adjacent binding electrodes may form one second binding pad, and there is no multiplexing of binding electrodes between the second binding pads. Each of the second power voltage first pad and the second power voltage second pad may include a plurality of binding electrodes, for example, 10-20 binding electrodes. As an example, each of the second power voltage first pad and the second power voltage second pad may include 14 binding electrodes. The number of binding electrodes included in each of the first power voltage first pad and the first power voltage second pad may be larger than that in the second power voltage first pad, for example, it may include 20 to 40 binding electrodes. As an example, the number of binding electrodes included in each of the first power voltage first pad and the first power voltage second pad is 28. Each of the chip power voltage first pad, the chip power voltage second pad, the driving data first pad, the driving data second pad, the chip control signal first pad and the chip control signal second pad may include 1 to 3 binding electrodes, for example, may include one binding electrode.

Referring to FIGS. 4 and 7, the second power voltage lead 325 is electrically connected with the second power voltage first pad 235 and the second power voltage second pad 245. The chip power lead 321 is electrically connected with the chip power voltage first pad 231 and the chip power voltage second pad 241. The chip control lead 324 is electrically connected with the chip control signal first pad 234 and the chip control signal second pad 244. The first power voltage lead 322 is electrically connected with the first power voltage first pad 232 and the first power voltage second pad 242. The driving data lead 323 is electrically connected with the driving data first pad 233 and the driving data second pad 243.

Optionally, referring to FIGS. 1-1, 2, 4 and 9, the metal wiring layer further includes a plurality of first fan-out leads 330 for connecting the first binding area 2301 and the plurality of driving leads 320, and a plurality of second fan-out leads 340 for connecting the second binding area 2401 and the plurality of driving leads 320. There is an overlapping area between an orthographic projection of the plurality of first fan-out leads 330 on the base substrate and an orthographic projection of the first pad sets 210 on the base substrate, and there is an overlapping area between an orthographic projection of the second fan-out leads 340 on the base substrate and the orthographic projection of the first pad sets 210 on the base substrate.

In an embodiment of the present disclosure, the first binding pad 230 and the driving lead 320 for loading the same driving signal are connected by the first fan-out lead 330, and the second binding pad 240 and the driving lead 320 for loading the same driving signal are connected by the second fan-out lead 340.

As an example, referring to FIG. 11, a second power voltage lead 325(2N) and a second power voltage first pad 235(2N) for loading the second power voltage are connected by the first fan-out lead 330, a chip power lead 321(N) and a chip power voltage first pad 231(N) for loading the chip power voltage are connected by the first fan-out lead 330, a chip control lead 324(2N) and a chip control signal first pad 234(2N) for loading the chip control signal are connected by the first fan-out lead 330, a first power voltage lead 322(N) and a first power voltage first pad 232(N) for loading the first power voltage are connected by the first fan-out lead 330, a chip control lead 324(2N−1) and a chip control signal first pad 234(2N−1) for loading the chip control signal are connected by the first fan-out lead 330, and a driving data lead 323(N) and a drive data first pad 233(N) for loading driving data are connected by the first fan-out lead 330.

As another example, referring to FIG. 12, a second power voltage lead 325(1) and a second power voltage second pad 245(1) for loading the second power voltage are connected by the second fan-out lead 340, a chip power lead 321(1) and a chip power voltage second pad 241(1) for loading the chip power voltage are connected by the second fan-out lead 340, a chip control lead 324(1) and a chip control signal second pad 244(1) for loading the chip control signal are connected by the second fan-out lead 340, a first power voltage lead 322(1) and a first power voltage second pad 242(1) for loading the first power voltage are connected by the second fan-out lead 340, a chip control lead 324(2) and a chip control signal second pad 244(2) for loading the chip control signal are connected by the second fan-out lead 340, and a driving data lead 323(1) and a driving data second pad 233(1) for loading driving data are connected by the second fan-out lead 340.

Figure 9:
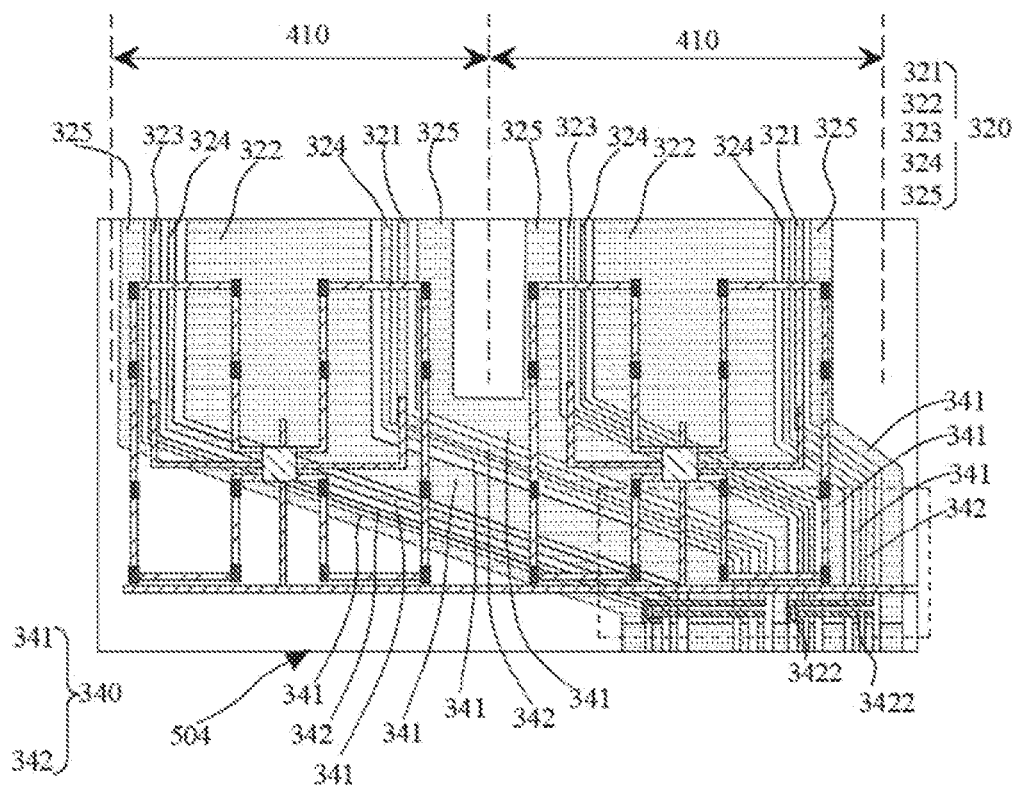
FIG. 9 schematically shows a partial structural diagram of the area B in FIG. 1-2.
Figure 10:
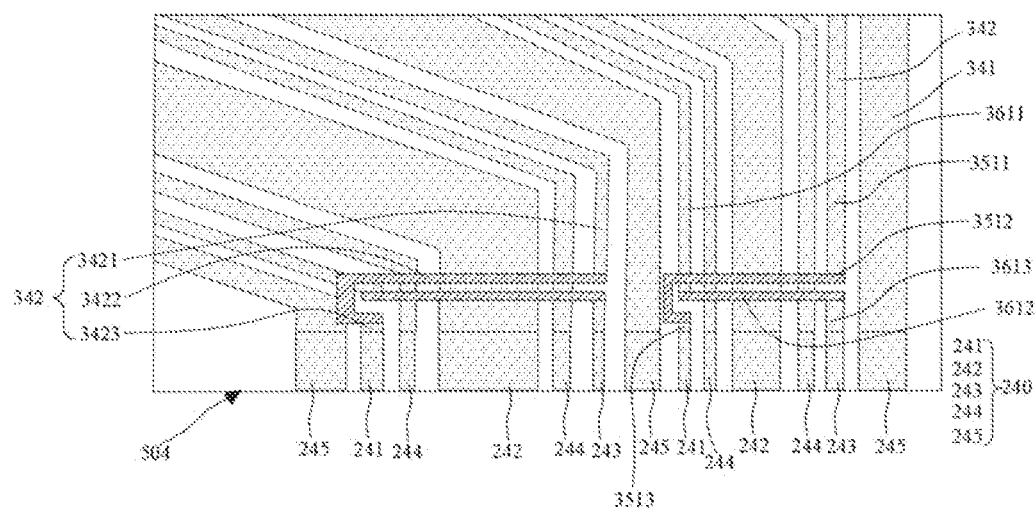
FIG. 10 schematically shows a partial structural diagram in a dashed box in FIG. 9.

In an embodiment of the present disclosure, the metal wiring layer includes a first metal wiring layer, a planarization layer and a second metal wiring layer which are sequentially laminated on the base substrate, and the first metal wiring layer and the second metal wiring layer are connected through a via hole penetrating through the planarization layer. Referring to FIG. 4, all of the first fan-out leads 330 are located on the first metal wiring layer. Referring to FIGS. 9 and 10, the second fan-out leads 340 include a first lead 341 and a second lead 342. The first lead 341 is located on the first metal wiring layer and electrically connected with the driving lead 320 and the second binding pad 240. The second lead 342 at least includes a first part 3421, a second part 3422 and a third part 3423 which are sequentially connected. The first part 3421 and the third part 3423 are located on the first metal wiring layer, and the second part 3422 is located on the second metal wiring layer.

The first part 3421 is electrically connected with the driving lead 320, and the third part 3423 is electrically connected with the second binding pad 240. In this way, the second lead 342 can avoid the first lead 341 by bridging the first metal wiring layer and the second metal wiring layer.

Optionally, referring to FIG. 4, the first fan-out lead 330 has a first straight line segment connected with the driving lead 320, a second straight line segment connected with the first binding pad 230, and a first oblique line segment connecting the first straight line segment and the second straight line segment. A width of the first straight line segment may be the same as the width of the connected driving lead 320. A width of the second straight line segment may be the same as the width of the connected first binding pad 230. With extending from one end connected with the first straight line segment to the other end connected with the second straight line segment, a width of the first oblique line segment uniformly transitions from being equal to the width of the driving lead 320 to being equal to the width of the connected first binding pad 230. An extending direction of the first straight line segment and an extending direction of the second straight line segment are parallel to an extending direction of the driving lead 320, and an extending direction of the first oblique line segment forms an acute angle with an extending direction of the driving lead 320. The width of any of the first straight line segment, the second straight line segment and the first oblique line segment is its size on the plane where the array substrate is located and perpendicular to the extending direction of the driving lead 320. Further, the width of the driving lead 320 is larger than the width of the connected first binding pad 230, so that the width of the first oblique line segment gradually decreases in the direction toward the first lateral side 503.

Optionally, referring to FIGS. 7 and 9, the second fan-out lead 340 has a third straight line segment connected with the driving lead 320, a fourth straight line segment connected with the second binding pad 240, and a second oblique line segment connecting the third straight line segment and the fourth straight line segment. The width of the third straight line segment may be the same as the width of the connected driving lead 320. The width of the fourth straight line segment may be the same as the width of the connected second binding pad 240. The extending direction of any of the third straight line segment and the fourth straight line segment is parallel to the extending direction of the driving lead 320. In the first lead 341, the extending direction of the second oblique line segment forms an acute angle with the extending direction of the driving lead 320. With extending from one end connected with the third straight line segment to the other end connected with the fourth straight line segment, the width of the second oblique line segment uniformly transitions from being equal to the width of the driving lead 320 to being equal to the width of the connected second binding pad 240. In the second lead 342, the second oblique line segment may include a bottom oblique line segment and a top oblique line segment. The bottom oblique line segment is located in the first metal wiring layer and connected with the third straight line segment, and extends to a side close to the second lateral side 504 along a space and a size defined by two adjacent other second fan-out leads 340. The top oblique line segment is located in the second metal wiring layer and connected with the bottom oblique line segment through a via hole, and may extend in a zigzag shape or straightly along an extending direction parallel to and/or perpendicular to the driving lead, so as to connect with the fourth straight line segment through a via hole. In this way, the third straight line segment and the bottom oblique line segment constitute the first part 3421 of the second lead 342, the top oblique line segment constitutes the second part 3422 of the second lead, and the fourth straight line segment constitutes the third part 3423 of the second lead. The width of any of the third straight line segment, the fourth straight line segment, the second oblique line segment of the first lead, and the bottom oblique line segment of the second lead is its size in the plane where the array substrate is located and perpendicular to the extending direction of the driving lead. Further, the width of the driving lead is larger than the width of the connected second binding pad, so that the width of at least a part of the second oblique line segment of the first lead and the bottom oblique line segment of the second lead gradually decreases in the direction toward the second lateral side.

Further, the plurality of first binding pads 230 and the plurality of second binding pads 240 are symmetrical about the same auxiliary line. The plurality of driving leads 320 include at least one first driving lead set. Any one of the first driving lead sets includes a plurality of first driving leads which are symmetrical about the auxiliary line and configured to load the same driving signal. The first leads 341 and the first fan-out leads 330 respectively connected with a plurality of first driving leads in any one of the first driving lead sets are distributed centrally symmetrically. At least one of the plurality of first binding pads 230 and at least one of the plurality of second binding pads 240 for loading the same driving signal are respectively connected with the plurality of first driving leads in any one of the first driving lead sets through the first fan-out leads 330 and the second fan-out leads 340. Thus, the design of the array substrate and the preparation of the mask plate can be facilitated. Especially in the layout design stage of the base substrate, after a layout design of the first fan-out lead is completed, the design layout of each first fan-out lead is rotated by 180 degrees along the central axis of the base substrate to obtain a design sketch of the second fan-out lead 340. Then, fine adjustment is performed on the basis of the design sketch of the second fan-out lead 340 to ensure the connection relationship between the second binding pad 240 and the driving lead 320. As an example, if one fan-out lead sketch on the design sketch of the second fan-out lead 340 enables the second binding pad 240 and the driving lead 320 for loading the same driving signal to be electrically connected, the fan-out lead sketch serves as an audit layout of the first lead 341. If one fan-out lead sketch on the design sketch of the second fan-out lead 340 cannot make the second binding pad 240 and the driving lead 320 for loading the same driving signal to be electrically connected, it may be adjusted in a bridging manner, and the adjusted fan-out lead sketch serves as the design layout of the second lead 342, so that the second binding pad 240 and the driving lead 320 for loading the same driving signal can be electrically connected through the second lead 342.

Further, the auxiliary line is located in the plane where the base substrate is located, is perpendicular to the first lateral side 503 and the second lateral side 504, and passes through the central axis 101 of the base substrate.

For example, referring to FIGS. 1-2 and 2, the driving lead 320 includes a plurality of second power voltage leads 325 for loading the second power voltage, and the second power voltage leads 325 are symmetrically arranged about an auxiliary line to form a first driving lead set. Referring to FIGS. 4 and 7, the first leads 341 and the first fan-out leads 330 connected with the second power voltage leads 325 are distributed centrally symmetrically.

As another example, referring to FIGS. 1-2 and 2, the driving leads 320 include chip control leads 324 for loading the chip control signal, and the chip control leads 324 are symmetrically arranged about the auxiliary line to form one first driving lead set. Referring to FIGS. 4 and 7, the first leads 341 and the first fan-out leads 330 connected with the chip control leads 324 are distributed centrally symmetrically.

Optionally, a thickness of the first metal wiring layer is greater than a thickness of the second metal wiring layer. The driving leads 320 are all located on the first metal wiring layer. A main material of the first metal wiring layer includes copper, and the first metal wiring layer may be formed by electroplating process.

Optionally, as shown in FIGS. 2, 5, 6, 8, 9 and 17, the metal wiring layer may also include connection leads 310 for realizing connections between the first pad sets 210 (blocked by the light-emitting element 900 in FIGS. 5, 6, 8 and 9), connections between the first pad sets 210 and the driving leads 320, and/or connections between the second pad sets 220 (blocked by the microchip 800 in FIGS. 5, 6, 8 and 9) and the driving leads 320. Further, the connection leads 310 may be located in the second metal wiring layer.

Optionally, the pad layer may be arranged on the same layer as the metal wiring layer, for example, the pad layer and the metal wiring layer may be prepared from the same one or more metal layers. In some embodiments, referring to FIGS. 5 and 8, the sub-pads in the first pad set 210 (blocked by the light-emitting element 900 in FIGS. 5 and 8) and the second pad set 220 (blocked by the microchip 800 in FIGS. 5 and 8) may be arranged on the same layer as the second metal wiring layer, that is, the first pad set 210 and the second pad set 220 may also be regarded as an extension or a part of the second metal wiring layer. In some embodiments, referring to FIGS. 4 and 7, the first binding pad 230 and the second binding pad 240 may be arranged on the same layer as the first metal wiring layer, that is, the first binding pad 230 and the second binding pad 240 may be regarded as an extension or a part of the second metal wiring layer.

As an example, the metal wiring layer and the pad layer of the array substrate 100 may be formed by using a method shown in the following steps S110 to S130.

In the step S110, referring to FIGS. 4 and 7, a first metal wiring layer, first binding pads 230 and second binding pads 240 are formed at a side of the base substrate. The first metal wiring layer, the first binding pads 230 and the second binding pads 240 at least include a copper seed layer and a copper growth layer which are sequentially laminated along the direction perpendicular to the plane where the base substrate is located, and the copper growth layer may be prepared by copper electroplating.

The step S110 may be implemented by various methods, as long as the first metal wiring layer, the first binding pads 230 and the second binding pads 240 can be prepared. As an example, in an embodiment of the present disclosure, an unpatterned copper seed layer covering the base substrate may be formed first, and then copper is deposited by copper electroplating to form an unpatterned copper growth layer, and finally the patterned copper seed layer and the unpatterned copper growth layer are patterned to obtain the first metal wiring layer, the first binding pads 230 and the second binding pads 240. As an example, in another embodiment of the present disclosure, a patterned copper seed layer may be formed first, then a pattern defining layer covering the base substrate and exposing the copper seed layer may be formed, and then a patterned copper growth layer may be formed on the patterned copper seed layer by copper electroplating to obtain the first metal wiring layer, the first binding pads 230 and the second binding pads 240; and the pattern defining layer is removed. In another embodiment of the present disclosure, an unpatterned copper seed layer covering the base substrate may be formed first, and then a pattern defining layer may be formed at a side of the copper seed layer away from the base substrate, wherein the pattern defining layer only exposes a position where a copper growth layer is required to be formed. Then, a patterned copper growth layer is formed on the unpatterned copper seed layer by copper electroplating, and the unpatterned copper seed layer is patterned after removing the pattern defining layer to obtain the first metal wiring layer, the first binding pads 230 and the second binding pads 240.

Optionally, along the direction perpendicular to the plane where the base substrate is located, the first metal wiring layer, the first binding pads 230 and the second binding pads 240 may further include a first adhesion metal layer between the copper seed layer and the base substrate in material, and the first adhesion metal layer may be made of molybdenum, molybdenum-copper alloy, molybdenum-niobium alloy, molybdenum-copper-niobium alloy or other metals or metal alloys, so as to improve the bonding strength between the first metal wiring layer, the first binding pads 230 and the second binding pads 240 and the base substrate.

Optionally, along the direction perpendicular to the plane where the base substrate is located, the first metal wiring layer, the first binding pads 230 and the second binding pads 240 may further include a first protective metal layer at a side of the copper growth layer away from the base substrate, and the first protective metal layer may be made of metal oxide such as nickel, copper-nickel alloy or indium tin oxide, so as to avoid surfaces of the first metal wiring layer, the first binding pads 230 and the second binding pads 240 from being oxidized.

Optionally, along the direction perpendicular to the plane where the base substrate is located, a thickness of the first metal wiring layer may be 1.5-20 microns, and in some embodiments, it may be 2-10 microns.

In the step S120, a planarization layer is formed. The planarization layer is located at a side of the first metal wiring layer, the first binding pads 230 and the second binding pads 240 away from the base substrate, and has a via hole exposing a part of the first metal wiring layer, at least a part of the first binding pads 230 and at least a part of the second binding pads 240. The via hole is configured to electrically connect between the second metal wiring layer and the first metal wiring layer, and is configured to electrically connect between the driving circuit board and the first binding pads 230 and the second binding pads 240. Further, the planarization layer is opened at positions corresponding to the first binding pads 230 and the second binding pads 240, so as to expose a part or all of the surfaces of the first binding pads 230 and the second binding pads 240 to be bound and connected with a golden finger structure of the driving circuit board.

The planarization layer may be made of organic material, especially photosensitive organic material, such as phenolic resin or cured acrylic resin.

Further, before forming the planarization layer, a passivation layer may also be formed, and is located at a side of the first metal wiring layer, the first binding pads 230 and the second binding pads 240 away from the base substrate, and the via hole on the planarization layer also penetrates through the passivation layer. The passivation layer may be made of silicon nitride to avoid the first metal wiring layer, the first binding pads 230 and the second binding pads 240 from being oxidized.

In the step S130, a metal layer is formed at a side of the planarization layer away from the base substrate, and then the metal layer is patterned to form the second metal wiring layer, the first pad sets 210 and the second pad sets 220.

Optionally, the second metal wiring layer, the first pad sets 210 and the second pad sets 220 may include a second adhesion metal layer and a copper metal layer along the direction perpendicular to the plane where the base substrate is located. The second adhesion metal layer may be made of molybdenum, molybdenum copper alloy, molybdenum niobium alloy, molybdenum copper niobium alloy or other metals or metal alloys.

Optionally, the second metal wiring layer, the first pad sets 210 and the second pad sets 220 may further include a second protective metal layer along the direction perpendicular to the plane where the base substrate is located. The second protective metal layer may be made of metal oxide such as nickel, copper-nickel alloy or indium-zinc oxide, so as to avoid the surfaces of the first metal wiring layer, the first binding pads 230 and the second binding pads 240 from being oxidized and improve the bonding strength with the light-emitting element 900 and the microchip 800.

Optionally, the preparation method of the array substrate may further include step S140: forming an organic protective layer at a side of the second metal wiring layer away from the base substrate. The organic protective layer exposes at least a part of surfaces of the first binding pads 230 and at least a part of surfaces of the second binding pads 240, and also exposes at least a part of surfaces of the first binding pad sets 210 and at least a part of surfaces of the second binding pad sets 220. As an example, the organic protective layer may be formed by screen printing green oil.

Optionally, the preparation method of the array substrate may further include step S150: forming a protective metal layer on the surfaces of the first pad sets 210 and the second pad sets 220, and the protective metal layer may be made of metal oxide such as nickel, copper-nickel alloy, or indium zinc oxide.

Optionally, along a long side direction 506 of the array substrate 100, a thickness difference of the driving lead 320 at different positions does not exceed 150%. In other words, the thickness of the thickest position of the driving lead 320 may not exceed 2.5 times of the thickness of the thinnest position of the driving lead 320, thus avoiding the reliability problem caused by excessive thickness difference of the driving lead 320 at different positions. Further, the thickness difference of the driving lead 320 at different positions does not exceed 100%, that is, the thickness of the thickest position of the driving lead 320 may not exceed twice the thickness of the thinnest position of the driving lead 320.

It can be understood that the thickness difference of the driving lead 320 at different positions is formed by the process of preparing the driving lead 320 by electroplating, rather than a deliberate design. If the copper electroplating process is adopted in the preparation process of the array substrate 100, the thickness of the copper growth layer at different positions will be different. This difference will have a certain impact on the debugging and reliability of the array substrate 100, and when the difference is too large, it may lead to debugging difficulties or reliability defects.

Further, along the long side direction 506 of the array substrate 100, thicknesses of the driving lead 320 at both ends thereof are different. The thickness of the driving lead 320 at the thicker end thereof is larger than the thickness of the driving lead 320 at the thinner end thereof by 10% or more. Furthermore, the thickness of the driving lead 320 at the thicker end thereof is more than 50% larger than the thickness of the driving lead 320 at the thinner end thereof. As an example, the thickness of the driving lead 320 at the thicker end thereof may be more than 7.5 microns, such as 10 microns, and the thickness of the driving lead 320 at the thinner end thereof may be about 5 microns.

Figure 15:
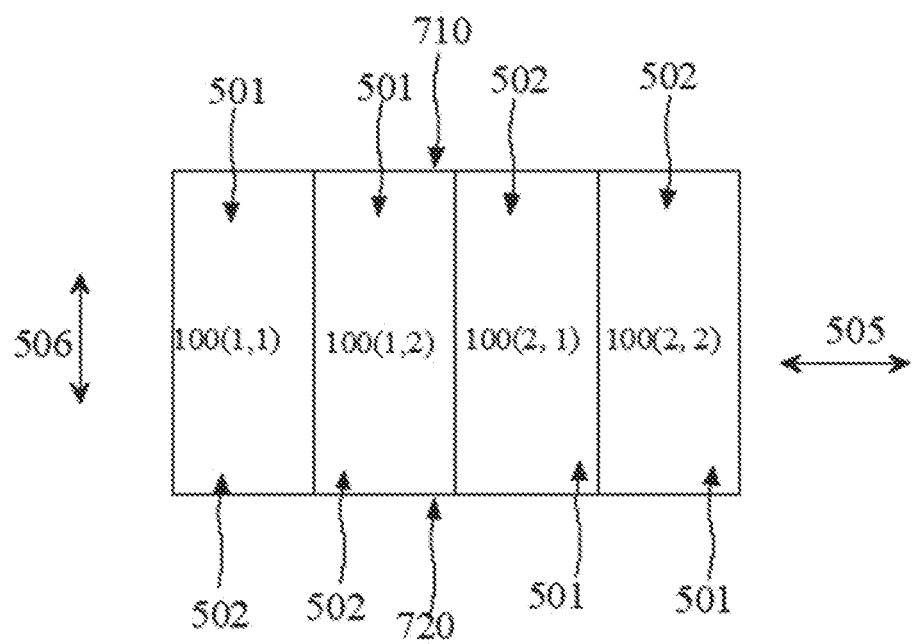
FIG. 15 schematically shows a schematic diagram of a plurality of array substrates being spliced with each other in a defective form.
Figure 16:
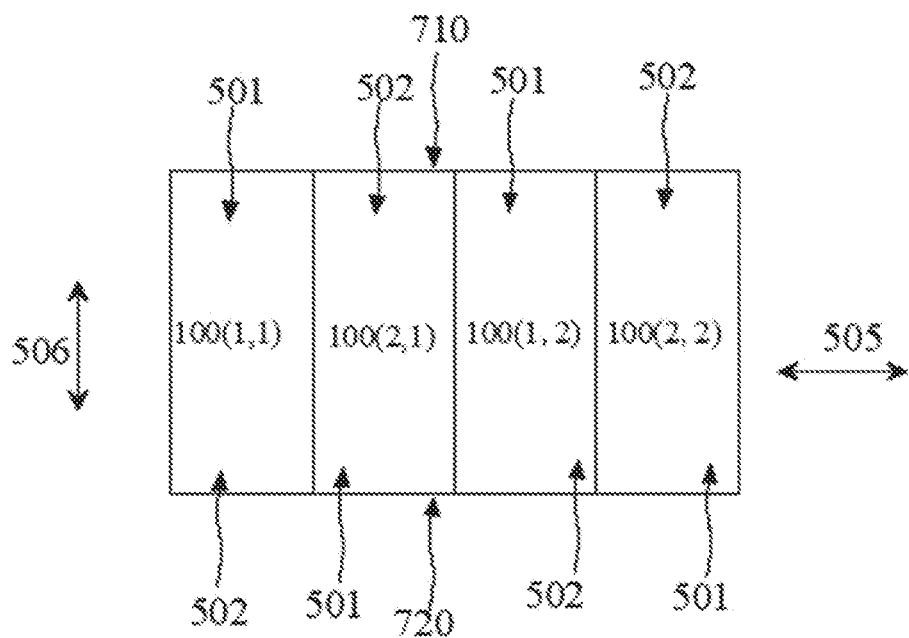
FIG. 16 schematically shows a schematic diagram of a plurality of array substrates being spliced with each other in a defective form.

Referring to FIG. 13, the thicker end of the driving lead 320 of the array substrate 100 can be defined as the first end 501 of the array substrate 100, and the thinner end of the driving lead 320 of the array substrate 100 can be defined as the second end 502 of the array substrate 100. When the plurality of array substrates 100 are spliced into a spliced array substrate 100, referring to FIGS. 15 and 16, if the first ends 501 of some of the array substrates 100 and the second ends 502 of other array substrates 100 are located at the same side of the spliced array substrate 100, the thickness distribution of the driving leads 320 on the spliced array substrate 100 will be irregular, which is not conducive to debugging and improving reliability. In this disclosure, since the first pad sets 210 on the array substrate 100 are arranged centrally symmetrically, the array substrate 100 may be rotated by 180 degrees, as shown in FIG. 14, so that the first ends 501 of the array substrates 100 are located at the same side of the spliced array substrate 100, the thickness distribution of the driving leads 320 on the spliced array substrate 100 may be regular, which is convenient for debugging and improving reliability.

As an example, when large-size display products are prepared by using high-generation production lines, a utilization ratio of the base motherboard 600 when four array substrates 100 are spliced into one large-size substrate (a four-splicing scheme) may be increased from 55% to 80% or more, compared with the utilization ratio of the base motherboard 600 when two array substrates 100 are spliced into one large-size substrate. Referring to FIG. 13, in order to realize the four-splicing scheme, the base motherboard 600 may include six base areas to be prepared to form the array substrate 100, that is, the base area corresponds to the base substrate of the array substrate 100. The six array substrates 100 are arranged in two rows and three columns. Any one of the rows includes three array substrates 100 arranged along the lateral side direction 505 of the array substrate 100, and any one of the columns includes two array substrates 100 arranged along the long side direction 506 of the array substrate 100. In the long side direction 506, the array substrate 100 includes a first end 501 near the edge of the base motherboard 600 and a second end 502 near a middle of the base motherboard 600. Since a film forming process and a patterning process are performed on the same base motherboard 600, and a mask plate used in the patterning process is inconvenient to rotate, film patterns prepared in the areas of the array substrates 100 are completely the same. In other words, the film pattern of the first end 501 of the array substrate 100(1, 1), the film pattern of the first end 501 of the array substrate 100(1,2), the film pattern of the first end 501 of the array substrate 100(1, 3), the film pattern of the second end 502 of the array substrate 100(2, 1), the film pattern of the second end 502 of the array substrate 100(2, 2), and the film pattern of the second end 502 of the array substrate 100(2, 3) are the same; the film pattern of the second end 502 of the array substrate 100(1,1), the film pattern of the second end 502 of the array substrate 100(1,2), the film pattern of the second end 502 of the array substrate 100(1, 3), the film pattern of the first end 501 of the array substrate 100(2, 1), the film pattern of the first end 501 of the array substrate 100(2, 2), and the film pattern of the first end 501 of the array substrate 100(2, 3) are the same. When the first metal wiring layer is prepared by electroplating process, it is likely that the copper growth layer is thick at the first end 501 of each of the array substrates 100 and the copper growth layer is thin at the second end 502. Especially, in order to realize the preparation of six array substrates 100 on the G6 base motherboard 600, a distance between the first end 501 of the array substrate 100 and the edge of the base motherboard 600 is very small, for example, it may be small up to 11.5 mm, so that the driving lead 320 has a large thickness difference along its extending direction. After cutting to obtain the array substrates 100, if the array substrate 100 cannot be rotated by 180 degrees along the central axis of the base substrate during the splicing process, the spliced substrates will have uneven thicknesses. As an example, if it cannot be rotated, it is required to be spliced in a manner shown in FIG. 15, FIG. 16, or other similar ways, so that the first end 501 of one array substrate 100 is adjacent to the second end 502 of another array substrate, and the spliced substrate has an uneven thickness.

Figure 14:
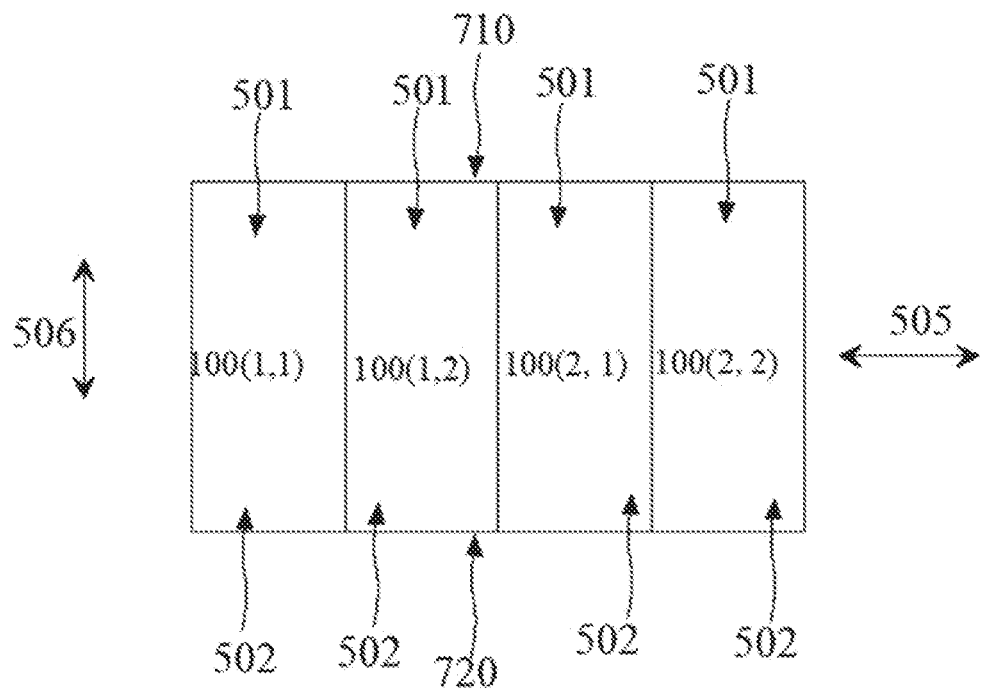
FIG. 14 schematically shows a structural diagram of splicing a plurality of array substrates with each other according to an embodiment of the present disclosure.

Referring to FIG. 14, the array substrate 100 of the present disclosure may be rotated by 180 degrees during splicing, so that the first end 501 of each of the array substrates 100 may be located at the same side of the spliced array substrate 100. As an example, the array substrates 100(2,1) and 100(2,2) may be spliced with the array substrates 100(1,1) and 100(1,2) after being rotated by 180 degrees, so that the first ends 501 of two adjacent array substrates are adjacent, and the second ends 502 of two adjacent array substrates are adjacent. Thus, in the direction perpendicular to the long side of the array substrate, thicknesses of the driving leads of the spliced substrate are substantially uniform; in the direction along the long side of the array substrate, thicknesses of the driving leads of the spliced substrates are substantially regularly thickened or thinned. This can make the debugging of the spliced substrate simpler, make the spliced substrate easier to be located, and eliminate the problem of affecting reliability.

In some embodiments, referring to FIG. 1-1, the array substrate 100 is rectangular and has a plurality of control areas 400 distributed in an array, and the control areas 400 form N control area columns 410 arranged along the lateral side direction 505 and 2N control area rows 420 arranged along the long side direction 506, wherein N is a positive integer.

Referring to FIG. 2, the array substrate 100 further includes a metal wiring layer including a plurality of connection leads 310 and a plurality of driving leads 320 extending along the long side direction.

Referring to FIGS. 1-1 and 2, in any one of the control area columns 410, the driving leads 320 include two second power voltage leads 325 for loading the second power voltage, a chip power lead 321 for loading the chip power voltage, two chip control leads 324 for loading the chip control signal, a first power voltage lead 322 for loading the first power voltage and a driving data lead 323 for loading driving data.

Figure 8:
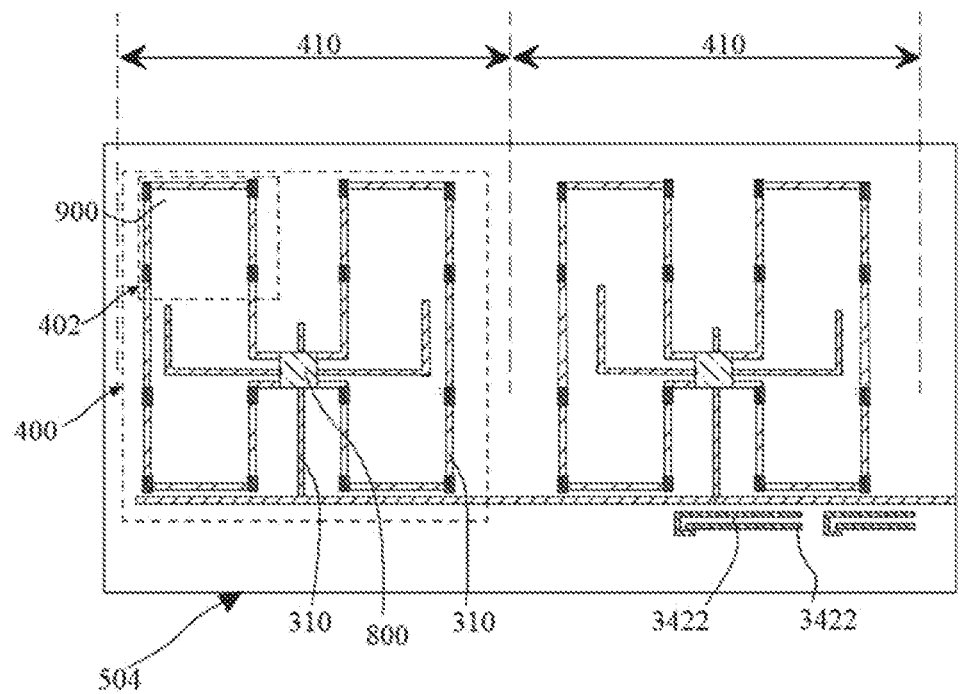
FIG. 8 schematically shows a partial structural diagram of a second metal wiring layer, a light-emitting element, and a microchip in the area B in FIG. 1-2.

Referring to FIG. 2, in any one of the control areas 400, the array substrate 100 includes a second pad set 220 and a plurality of pad connection circuits 401 corresponding to the data sub-pads 225 in the second pad set 220 one by one. Referring to FIG. 17, any one of the pad connection circuits 401 includes at least one first pad set 210, and the first pad sets 210 are connected through connection leads 310, a first end of each of the pad connection circuits 401 is connected to the corresponding data sub-pad 225 through the connection lead 310, and a second end of each of the pad connection circuits 401 is electrically connected to the second power voltage lead 325 through the connection lead 310. Referring to FIGS. 5 and 8, the first pad set 210 on any one of the pad connection circuits 401 may bind the light-emitting element 900 to form the light-emitting circuit 402.

Referring to FIG. 2, in any one of the control areas 400, the second ends of some of the pad connection circuits 401 are electrically connected with one second power voltage lead 325 through connection leads 310, and the second ends of other pad connection circuits 401 are electrically connected with another second power voltage lead 325 through connection leads 310. The chip power sub-pad 221 is electrically connected with the chip power lead 321 by the connection lead 310, the first power sub-pad 222 is electrically connected with the first power voltage lead 322 by the connection lead 310, and the driving data sub-pad 223 is electrically connected with the driving data lead 323 by the connection lead 310.

Referring to FIG. 2, in the array substrate 100, the chip control leads 324 are arranged to correspond to the control area rows 420 one by one, and the control signal sub-pads 224 in any one of the control area rows 420 are electrically connected with the corresponding chip control leads 324 through the connection leads 310.

Optionally, referring to FIGS. 4 and 7, in two adjacent control area columns 410, two adjacent second power voltage leads 325 may be connected with each other at a position close to the first binding pad 230 or the second binding pad 240. Further, two first fan-out leads 330 connected with two adjacent second power voltage leads 325 may be connected with each other to form one fan-out lead, and two second fan-out leads 340 connected with two adjacent second power voltage leads 325 may be connected with each other to form one fan-out lead. Furthermore, two second power voltage first pads 235 connected with two adjacent second power voltage leads 325 may be connected with each other, so as to form a second power voltage first pad 235, and two second power voltage second pads 245 connected with two adjacent second power voltage leads 325 may be connected with each other, so as to form a second power voltage second pad 245.

As an example, referring to FIG. 11, the control area column 410(N) and the control area column 410(N−1) are two adjacent control area columns 410. Two first fan-out leads 330 connected to the second power voltage lead 325 (2N−1) and the second power voltage lead 325 (2N−2) are connected with each other and merged into one first fan-out lead 330 with a larger width. The second power voltage first pad 235(2N−1) and the second power voltage first pad 235(2N−2) connected to the second power voltage lead 325(2N−1) and the second power voltage lead 325(2N−2) are connected with each other and merged into one second power voltage first pad 235 with a larger width.

As an example, referring to FIG. 12, the control area column 410(1) and the control area column 410(2) are two adjacent control area columns 410. Two second fan-out leads 340 connected to the second power voltage lead 325(2) and the second power voltage lead 325(3) are connected with each other and merged into one second fan-out lead 340 with a larger width. The second power voltage second pad 245(2) and the second power voltage second pad 245(3) connected to the second power voltage lead 325(2) and the second power voltage lead 325(3) are connected with each other and merged into one second power voltage second pad 245 with a larger width.

Optionally, the first metal wiring layer may be provided with a hollowed-out area between two adjacent second power voltage leads 325, so as to avoid that a metal area of the first metal wiring layer is too large to affect subsequent exposure and other procedures. As an example, referring to FIG. 12, the first metal wiring layer is hollowed out between the second power voltage lead 325(2) and the second power voltage lead 325(3).

Furthermore, in the array substrate, the control signal sub-pads in the $i^{th}$ control area row are electrically connected with the $i^{th}$ chip control lead through connection leads; or, in the array substrate, the control signal sub-pads in the $i^{th}$ control area row are electrically connected with the 2N−i+$1^{th}$ chip control lead through the connection leads; wherein 2N and i is a positive integer. The control area columns and the driving leads are sequentially arranged along the lateral side direction; the control area rows are sequentially arranged along the long side direction.

In this way, it can be ensured that the first binding pad 230 and the second binding pad 240 of the array substrate 100 can be applied to the same driving circuit board and the same driving timing, and the development cost of the driving circuit board can be reduced.

Further, referring to FIG. 2, in the control area 400, a second power voltage lead 325, a driving data lead 323, a chip control lead 324, a first power voltage lead 322, a chip control lead 324, a chip power lead 321 and a second power voltage lead 325 extend along the lateral side direction 505 of the array substrate 100. The width of the driving data lead 323 and the width of the chip power lead 321 are substantially the same.

Further, referring to FIG. 4, the first fan-out lead 330 is located on the first metal wiring layer, and the driving lead 320 and the first binding pad 230 for loading the same driving signal are connected through the first fan-out lead 330. Referring to FIGS. 7, 8, 9 and 10, the second fan-out leads 340 includes a first lead 341 and a second lead 342. The first lead 341 is located on the first metal wiring layer. The second binding pad 240 and the first power voltage lead 322 for loading the first power voltage are electrically connected through the first lead 341, the second binding pad 240 and the chip control lead 324 for loading the chip control signal are electrically connected through the first lead 341, and the second binding pad 240 and the second power voltage lead 325 for loading the second power voltage are electrically connected through the first lead 341. The second lead 342 at least includes a first part 3421, a second part 3422 and a third part 3423 sequentially connected. The first part 3421 and the third part 3423 are located on the first metal wiring layer, and the second part 3422 is located on the second metal wiring layer. The second binding pad 240 and the chip power lead 321 for loading the chip power voltage are electrically connected through the second lead 342, the second binding pad 240 and the chip power lead 321 for loading driving data are electrically connected through the driving data lead 323.

As an example, referring to FIGS. 7 and 10, the second leads 342 may include a driving data fan-out lead connecting the driving data second pad 243 and the driving data lead 323, and a chip power voltage fan-out lead connecting the chip power voltage second pad 241 and the second power voltage lead 325. A first part 3611 and a third part 3613 of the driving data fan-out lead are respectively located on the first metal wiring layer, and a second part 3612 is located on the second metal wiring layer. A first part 3511 and a third part 3513 of the chip power voltage fan-out lead are respectively located on the first metal wiring layer, and a second part 3512 is located on the second metal wiring layer. Further, the second part 3612 of the driving data fan-out lead and the second part 3512 of the chip power voltage fan-out lead respectively extend along the lateral side direction 505 of the array substrate 100.

As an example, referring to FIG. 2, FIG. 5 (light-emitting elements 900 are bound to the first pad set 210) and FIG. 8 (light-emitting elements 900 are bound to the first pad set 210), the array substrate 100 includes four pad connection circuits 401 in one control area 400. Accordingly, the second pad set 220, on which the microchip 800 is bound, includes four data sub-pads 225. Referring to FIG. 17, any one of the pad connection circuits 401 includes four first pad sets 210. The first sub-pad 211 of the first one 210(1) of the first pad sets is connected with the second power voltage lead 325 through the connection lead 310, and the second sub-pad 212 of the first one 210(1) of the first pad sets is connected with the first sub-pad 211 of the second one 210(2) of the first pad sets through the connection lead 310, the second sub-pad 212 of the second one 210(2) of the first pad sets is connected with the first sub-pad 211 of the third one 210(3) of the first pad sets through the connection lead 310, the second sub-pad 212 of the third one 210(3) of the first pad sets is connected with the first sub-pad 211 of the fourth one 210(4) of the first pad sets through the connection lead 310, and the second sub-pad 212 of the fourth one 210(4) of the first pad sets is connected with the corresponding data sub-pad 225 through the connection lead 310.

In this way, referring to FIGS. 5 and 8, in the light-emitting substrate based on the array substrate 100, one microchip 800 and four light-emitting circuits 402 are arranged in one control area 400, and any one of the light-emitting circuits 402 includes four light-emitting elements 900 connected in series through a pad connection circuit 401; the microchip 800 may control the four light-emitting circuits 402 to emit light independently.

In an embodiment of the present disclosure, N is equal to 12. In this way, a suitable array substrate 100 can be prepared, so that the array substrate 100 may be applied to 75-inch liquid crystal display devices.

An embodiment of the present disclosure also provides a light-emitting substrate including any one of the light-emitting substrates described in the embodiments of the array substrate 100. The light-emitting substrate may be an illuminating lamp, a Micro LED display panel, a lamp panel of a liquid crystal display device, and the like. Since the light-emitting substrate has any one of the array substrates 100 described in the above embodiments of the array substrate 100, it has the similar beneficial effects, which will not be repeated herein.

Optionally, the light-emitting substrate further includes a plurality of light-emitting elements 900 correspondingly bound with the first pad sets 210 one by one.

In some embodiments, the light-emitting substrate further includes a plurality of microchips 800 correspondingly bound with the second pad sets 220 one by one. The microchips 800 are used to drive the light-emitting elements 900 of the light-emitting substrate to emit light.

In some embodiments, the light-emitting substrate includes a plurality of array substrates 100 spliced with each other. In this way, the spliced light-emitting substrate with a larger size can be obtained by splicing.

In some embodiments, when the thicknesses of the two ends of the driving leads 320 are different along the long side direction 506 of the array substrate 100, referring to FIG. 12, the light-emitting substrate has a first side 710 and a second side 720 which are oppositely arranged, and the array substrates 100 are arranged side by side along the extending direction of the first side 710. In each of the array substrates 100, a part of the driving lead 320 with a larger thickness is close to the first side 710 of the light-emitting substrate. In each of the array substrates 100, a part of the driving lead 320 with a smaller thickness is close to the second side 720 of the light-emitting substrate.

In this way, thickness variations of the driving leads 320 in the spliced light-emitting substrate may be consistent, improving adjustability and reliability of the light-emitting substrate.

Figure 18:
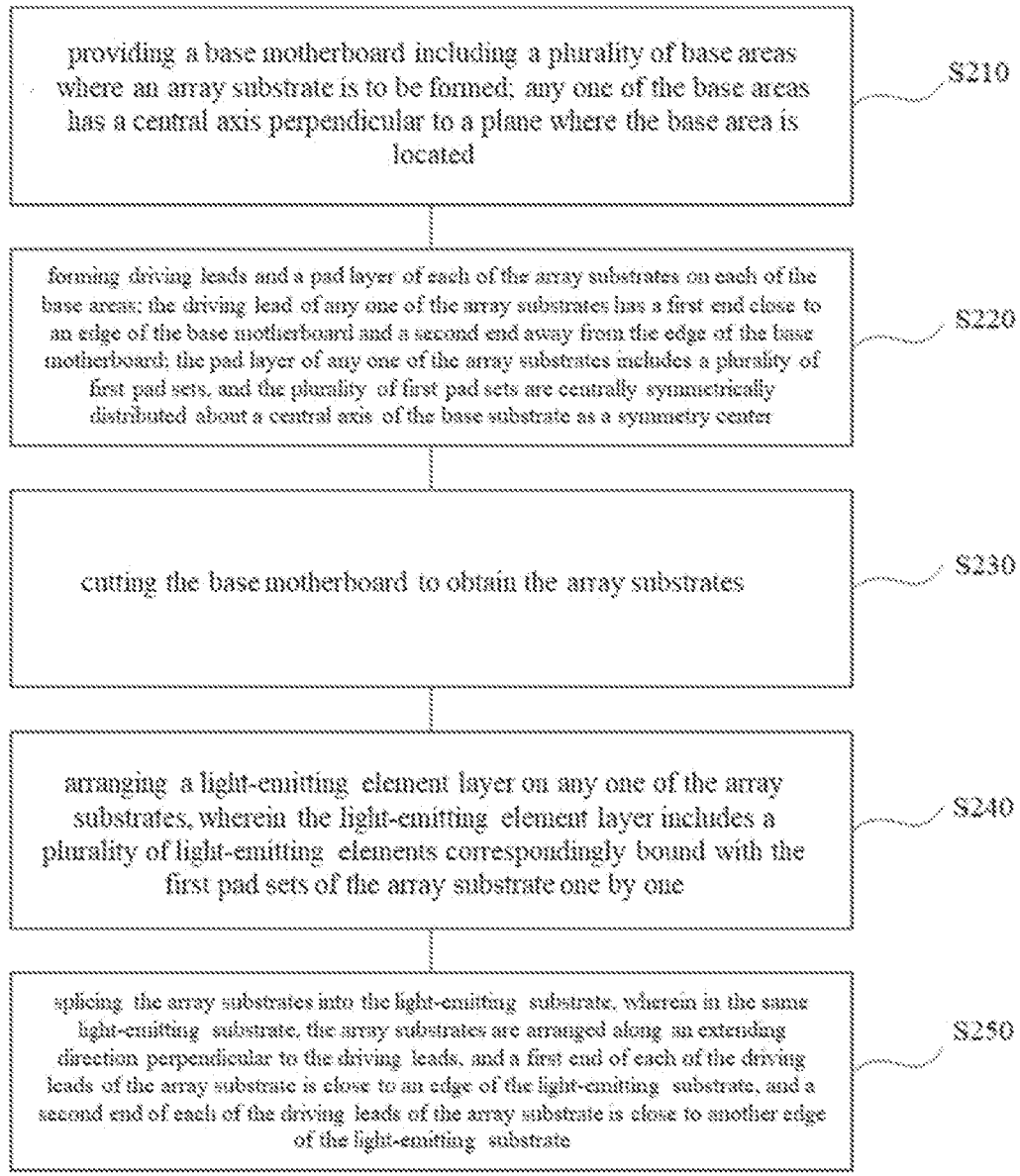
FIG. 18 schematically shows a flow chart of a preparation method of a light-emitting substrate.

The present disclosure also provides a preparation method of a light-emitting substrate. Referring to FIG. 18, the preparation method of the light-emitting substrate includes the followings steps:

S210: referring to FIG. 13, providing a base motherboard 600, wherein the base motherboard 600 includes a plurality of base areas where the array substrates 100 are to be formed, any one of base areas has a central axis 101 perpendicular to a plane where the base area is located;

S220: forming driving leads and a pad layer of each of the array substrates 100 on each of the base substrates; the driving lead of any one of the array substrates 100 has a first end 501 close to an edge of the base motherboard 600 and a second end 502 away from the edge of the base motherboard 600, the pad layer of any one of the array substrates 100 includes a plurality of first pad sets 210, and the plurality of first pad sets 210 are centrally symmetrically distributed about a center axis of the base area as a symmetry center;

S230: cutting the base motherboard 600 to obtain the array substrates 100;

S240: arranging a light-emitting element layer on any one of the array substrates 100, wherein the light-emitting element layer includes a plurality of light-emitting elements 900 correspondingly bound with the first pad sets 210 of the array substrate 100 one by one;

S250: referring to FIG. 14, splicing the plurality of array substrates 100 into a light-emitting substrate; wherein in the same light-emitting substrate, the array substrates 100 are arranged along an extending direction perpendicular to the driving leads 320, and a first end of each of the driving leads 320 of the array substrate 100 is close to an edge of the light-emitting substrate, and a second end of each of the driving leads 320 of the array substrate 100 is close to another edge of the light-emitting substrate.

According to the preparation method of the light-emitting substrate disclosed by the present disclosure, the utilization rate of the base motherboard 600 can be improved, and the defects of complex debugging and reduced reliability due to uneven thickness of the driving leads 320 can be overcome. The base motherboard 600 may be a glass substrate. It can be understood that for each array substrate, only one of the first binding area and the second binding area is used to connect with the driving circuit board to drive the array substrate, while the other is not connected with the driving circuit board. The binding area may be covered with an insulating layer, or a connection relationship between the binding pad and the driving lead may be cut off by a laser, so as to prevent the introduction of electrostatic charges from affecting the yield and service life of the array substrate.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

What is claimed is:

1. An array substrate, comprising:
   at least one set of a first lateral side and a second lateral side which are oppositely arranged;
   a first binding area arranged along the first lateral side and a second binding area arranged along the second lateral side;
   a base substrate and a pad layer arranged on a main surface of the base substrate, wherein: the pad layer comprises a plurality of first binding pads in the first binding area, and a plurality of second binding pads in the second binding area; any one of the first binding area and the second binding area is configured to connect with a driving circuit board to drive the array substrate; and the array substrate is polygonal;
   a metal wiring layer, wherein the metal wiring layer comprises a plurality of driving leads, a plurality of first fan-out leads for connecting the first binding area and the plurality of driving leads, and a plurality of second fan-out leads for connecting the second binding area and the plurality of driving leads; wherein
   the pad layer further comprises a plurality of first pad sets; and
   the array substrate further comprises: an overlapping area between an orthographic projection of the plurality of first fan-out leads on the base substrate and an orthographic projection of the plurality of first pad sets on the base substrate, and an overlapping area between an orthographic projection of the plurality of second fan-out leads on the base substrate and the orthographic projection of the plurality of first pad sets on the base substrate.

2. The array substrate according to claim 1, wherein the plurality of first pad sets are distributed centrally symmetrically.

3. The array substrate according to claim 2, wherein any one of the first pad sets comprises a first sub-pad and a second sub-pad arranged in pair.

4. The array substrate according to claim 2, wherein the pad layer further comprises a plurality of second pad sets, and any one of the second pad sets is configured to connect with a microchip.

5. The array substrate according to claim 4, wherein any one of the second pad sets comprises: a plurality of data sub-pads for connecting with at least a part of the first pad sets.

6. The array substrate according to claim 1, wherein:
   at least two of the first binding pads are respectively configured to load different driving signals; and at least two of the second binding pads are respectively configured to load different driving signals; and
   in the plurality of first binding pads and the plurality of second binding pads, at least one of the plurality of first binding pads and at least one of the plurality of second binding pads for loading the same driving signal are symmetrical about a center axis of the base substrate.

7. The array substrate according to claim 6, wherein the plurality of driving leads are centrally symmetrically distributed.

8. The array substrate according to claim 1, wherein:
   the metal wiring layer comprises a first metal wiring layer, a planarization layer, and a second metal wiring layer sequentially laminated on the base substrate;

the first metal wiring layer and the second metal wiring layer are connected through a via hole penetrating through the planarization layer;

the first fan-out leads are all located on the first metal wiring layer;

the second fan-out leads comprises a first lead and a second lead;

the first lead is located on the first metal wiring layer and is electrically connected with the driving lead and the second binding pad;

the second lead at least comprises a first part, a second part, and a third part which are sequentially connected;

the first part and the third part are located on the first metal wiring layer, and the second part is located on the second metal wiring layer; and the first part is electrically connected with the driving lead, and the third part is electrically connected with the second binding pad.

9. The array substrate according to claim 8, wherein:

the plurality of first binding pads and the plurality of second binding pads are symmetrical about the same auxiliary line;

the plurality of driving leads comprise at least one first driving lead set comprising a plurality of first driving leads which are symmetrical about the auxiliary line and configured to load the same driving signal; and the first leads and the first fan-out leads respectively connected with the plurality of first driving leads in the at least one first driving lead set are centrally symmetrically distributed.

10. The array substrate according to claim 8, wherein a thickness of the first metal wiring layer is greater than a thickness of the second metal wiring layer, and the driving leads are all located on the first metal wiring layer.

11. The array substrate according to claim 7, wherein a thickness difference of the driving lead at different positions along a long side direction of the array substrate does not exceed 150%.

12. The array substrate according to claim 11, wherein thicknesses of the driving lead at two ends thereof are different along the long side direction of the array substrate; and the thickness of the driving lead at the thicker end thereof is larger than the thickness of the driving lead at the thinner end thereof by 10% or more.

13. The array substrate according to claim 4, wherein:

the array substrate is rectangular and has a plurality of control areas distributed in an array, and the control areas form N control area columns arranged along a lateral side direction and 2N control area rows arranged along a long side direction, wherein N is a positive integer;

any one of the second pad sets further comprises a chip power sub-pad for connecting with a chip power pin of the microchip, a first power sub-pad for connecting with a first power pin of the microchip, a driving data sub-pad for connecting with a driving data pin of the microchip, and a control signal sub-pad for connecting with a control signal pin of the microchip;

the metal wiring layer further comprises a plurality of connection leads, and the plurality of driving leads extend along the long side direction;

in any one of the control area columns, the driving leads comprise two second power voltage leads for loading a second power voltage, a chip power lead for loading a chip power voltage, two chip control leads for loading a chip control signal, a first power voltage lead for loading a first power voltage and a driving data lead for loading driving data;

in any one of the control areas, the array substrate comprises one of the second pad sets and a plurality of pad connection circuits corresponding to the data sub-pads in the second pad sets one by one; any one of the pad connection circuits comprises at least one of the first pad sets, and the first pad sets are connected through the connection leads; a first end of each of the pad connection circuits is connected with a corresponding data sub-pad through the connection lead;

in any one of the control areas, second ends of some of the pad connection circuits are electrically connected with one of the second power voltage leads through the connection leads, and second ends of other of the pad connection circuits are electrically connected with another one of the second power voltage leads through the connection leads; the chip power sub-pad is electrically connected with the chip power lead through the connection lead, the first power sub-pad is electrically connected with the first power voltage lead through the connection lead, and the driving data sub-pad is electrically connected with the driving data lead through the connection lead; and in the array substrate, the chip control leads are arranged to correspond to the control area rows one by one, and each of the control signal sub-pads in any one of the control area rows is electrically connected with a corresponding chip control lead through the connection lead.

14. The array substrate according to claim 13, wherein:

in the array substrate, each of the control signal sub-pads in the $i^{th}$ control area row is electrically connected with the $i^{th}$ chip control lead through the connection lead; or, in the array substrate, each of the control signal sub-pads in the $i^{th}$ control area row is electrically connected with the (2N−i+1)th chip control lead through the connection lead; and wherein $1 \leq i \leq 2N$, and i is a positive integer.

15. A light-emitting substrate, comprising:

the array substrate according to claim 1.

16. The light-emitting substrate according to claim 15, wherein:

the light-emitting substrate further comprises a plurality of light-emitting elements corresponding to and being bound with the plurality of first pad sets one by one; or the light-emitting substrate further comprises a plurality of microchips corresponding to and being bound with the second pad sets one by one.

17. The light-emitting substrate according to claim 15, wherein the light-emitting substrate comprises a plurality of array substrates spliced with each other.

18. The light-emitting substrate according to claim 17, wherein:

thicknesses of the driving lead at two ends thereof are different along a long side direction of the array substrate, and the light-emitting substrate has a first side and a second side oppositely arranged, and the array substrates all are arranged side by side along an extending direction of the first side; a part of the driving lead with larger thickness in each of the array substrates is close to the first side of the light-emitting substrate; and a part of the driving lead with smaller thickness in each of the array substrates is close to the second side of the light-emitting substrate.

* * * * *